United States Patent [19]

Tsunooka et al.

[11] Patent Number: 5,169,551

[45] Date of Patent: Dec. 8, 1992

[54] PIEZOELECTRIC COMPOSITE MATERIAL

[75] Inventors: Tsutomu Tsunooka; Shigeo Saito; Takashi Yamamoto; Hiroshi Ito, all of Aichi, Japan

[73] Assignee: NGK Spark Plug Co., Ltd., Aichi, Japan

[21] Appl. No.: 488,833

[22] Filed: Mar. 6, 1990

Related U.S. Application Data

[60] Division of Ser. No. 264,000, Oct. 25, 1988, Pat. No. 4,917,810, which is a continuation of Ser. No. 827,028, Feb. 5, 1986, abandoned, which is a continuation of Ser. No. 529,631, Aug. 29, 1983, abandoned, which is a continuation of Ser. No. 295,208, Aug. 24, 1981, abandoned, which is a continuation of Ser. No. 44,741, Jun. 1, 1979, abandoned.

[30] Foreign Application Priority Data

Jun. 1, 1978 [JP] Japan .................... 53-64890

[51] Int. Cl.$^5$ ................ C04B 35/49; C04B 35/78
[52] U.S. Cl. .................... 252/62.9; 501/134; 501/138; 264/56; 264/67
[58] Field of Search ............ 264/67; 252/62.9; 501/134, 138

[56] References Cited

U.S. PATENT DOCUMENTS 4,917,810  4/1990  Tsunooka et al. ............ 252/62.9

Primary Examiner—Ellen McAvoy
Attorney, Agent, or Firm—Sughrue, Mion, Zinn Macpeak & Seas

[57] ABSTRACT

A piezoelectric composite material prepared by compounding a ferroelectric ceramic powder comprising microcrystals having virtually single domains and a polymer. This composite has both the high piezoelectric property of the ferroelectric ceramic and the pliability of the polymer.

31 Claims, 10 Drawing Sheets

EXCESS PbO 0%

EXCESS PbO 10%

EXCESS PbO 5.3%

⇑
ETCHING TREATMENT

⇑
NO ETCHING TREATMENT
(X500)

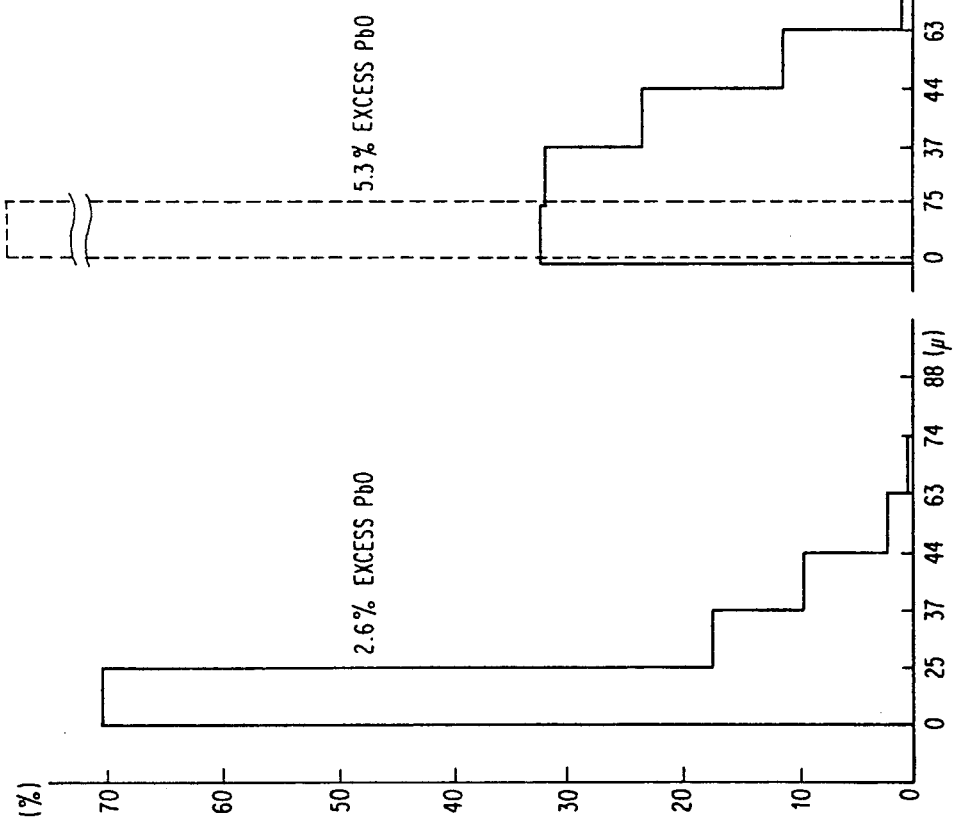

PIEZOELECTRIC COMPOSITE MATERIAL

This is a divisional of application Ser. No. 07/264,000 filed Oct. 25, 1988, now U.S. Pat. No. 4,917,810; which is a continuation of application Ser. No. 06/827,028 filed Feb. 5, 1986, now abandoned which is a continuation of application Ser. No. 06/529,631 filed Aug. 29, 1983, now abandoned which is a continuation of application Ser. No. 06/295,208 filed Aug. 24, 1981, now abandoned which is a continuation of application Ser. No. 06/044,741 filed Jun. 1, 1979 now abandoned.

BACKGROUND OF THE INVENTION

1. Field of the Invention

The present invention relates to a piezoelectric composite material and more particularly to a piezoelectric material obtained by compounding a ferroelectric ceramic powder and a polymeric binder.

2. Description of the Prior Art

General attempts to obtain piezoelectric materials by compounding polymers and ferroelectric ceramic powders have been known [*Mat. Res. Bull.*, Vol. 13, pp. 599-607, (1978), Pergamon Press Inc. (U.S.A.)]. However, ferroelectric ceramic powders prepared by conventional processes such as those described below have been attended by conspicuous difficulties. That is to say, ferroelectric ceramic powders prepared by grinding ferroelectric ceramics prepared by a solid phase reaction under applied heat such as titanium-containing ceramics (e.g., $BaTiO_3$, $PbTiO_3$, $PbZrO_3$-$PbTiO_3$ solid solutions, etc.) or single crystals such as potassium sodium niobate (PSN) and the like, using a ball mill, an oscillation mill or the like, and adjusting the resulting powders so as to obtain a desired size distribution barely provide even low piezoelectric properties in a composite material which is quite contrary to what one would expect based on the piezoelectric characteristics of the ferroelectric ceramics themselves. In addition, this type of composite material is fragile and hard to mold because it lacks pliability, and moldings thereof are heavy and expensive. As a result of these drawbacks the point at which the use of composite materials of this type is practical has, for all intents and purposes, not yet been reached.

Extensive research directed to determining the origin of the deterioration in properties as described above has lead to the conclusion that in the crushing process (pulverization) carried out after the solid phase reaction or the preparation of single crystals, structural fractures arise in the microcrystals resulting in the formation of numerous domains and subsequently to the formation of distorted phases. It is almost impossible to force all the resulting domains and distorted phases to line up in the same direction as that of the applied electric field even when a voltage close to the maximum voltage which the composite material can resist without dielectric breakdown is applied to polarize the composite material. This is because the electric field capable of acting effectively upon the individual ceramic grains compounded with the polymer is markedly reduced to several tenths or several hundredths of the electric field in the compounding state, taking into account the ratio of the dielectric constant of the polymer to that of the ceramic. Therefore, admixing of ceramic powders or single crystals with polymers cannot impart piezoelectric properties to the resulting composite materials to an appreciable extent.

SUMMARY OF THE INVENTION

Therefore, one object of the present invention is to provide a method of preparing a ferroelectric ceramic powder comprising microcrystals having virtually single domains free from the above drawbacks.

Another object of the present invention is to provide a piezoelectric polymer composite material possessing excellent piezoelectric efficiency in comparison to conventional materials.

Another object of the present invention is to provide a ferroelectric ceramic powder which can be used in piezoelectric composite materials in higher amounts.

The above-described objects are attained by compounding a ferroelectric ceramic powder comprising microcrystals having virtually single domains prepared by one of the methods described below and a polymer.

BRIEF DESCRIPTION OF THE DRAWINGS

FIGS. 11 and 12 are graphs showing size distributions of powders obtained by etching treatment after rapid cooling crushing and also obtained by mechanical crushing.

DETAILED DESCRIPTION OF THE INVENTION

Figure 1:
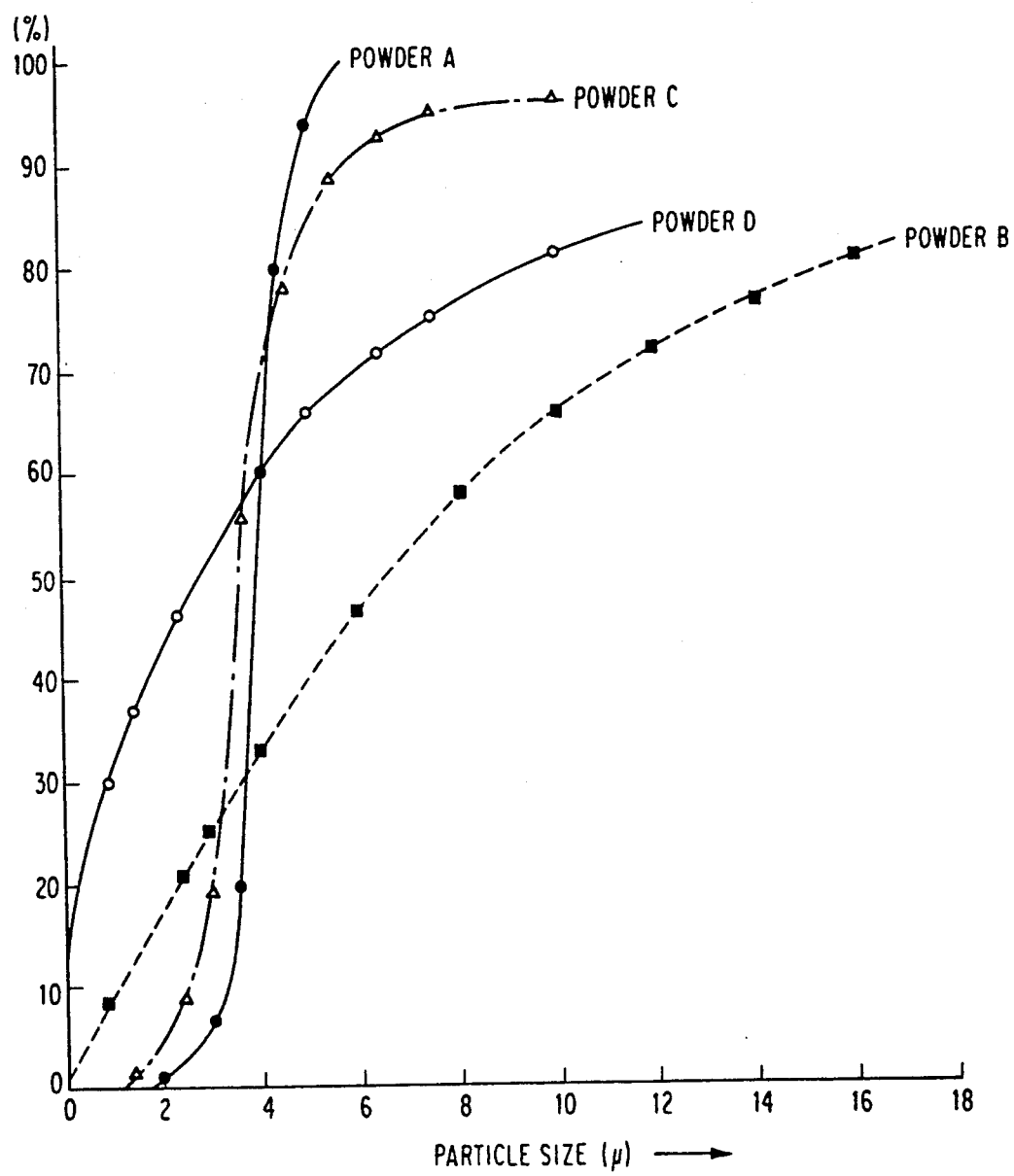
FIG. 1 is a plot of size distribution for a ferroelectric ceramic powder comprising microcrystals having virtually single domains which have been prepared by the method of the present invention, and of a ceramic powder prepared by a conventional crushing process.

In any of the following methods for preparing a ferroelectric ceramic powder of virtually single domain microcrystals (with the exception of the coprecipitation process), starting powders are, in the first place, mixed and compounded with each other in amounts corresponding to the composition of the desired ferroelectric ceramic. The compounded starting powders are then processed in accordance with one of the following methods.

A first method comprises heating the compounded starting powders in the appropriate atmosphere generally at about 500° to 1,500° C. such that they undergo a solid phase reaction. The thus-obtained product is referred to as a powdery product. The solid phase reaction may be repeated after crushing and mixing treatments are carried out after cooling as required. Further, the final cooling may be achieved rapidly, i.e., by quenching.

A second method comprises, in sequence, shaping the compounded starting powders into a temporary form by a conventional dry or wet process, heating (generally at about 500° to 1,500° C.) the resulting molding such that the starting powders undergo a solid phase reaction or subjecting the resulting molding to a sintering treatment, and rapidly cooling the reaction product to pulverize it. The solid phase reaction or the sintering treatment may be repeated two or more times. Ferroelectric ceramics having a relatively large axial ratio [e.g., length:width (c/a) is about 1.04 or more] in a crystalline state, such as $PbTiO_3$, do not necessarily have to be subjected to rapid cooling in the final cooling process but may be allowed to stand in contact with air and cool naturally to room temperature. In this case the requisite dissociation is also observed among the grains. The ceramics having a large axial ratio will naturally pulverize without rapid cooling.

A third method comprises, in sequence, shaping the powdery treatment product obtained in the first method described above into a temporary form by a conventional dry or wet process, subjecting the resulting molding to a sintering treatment at about 500° to 1,500° C., and rapidly cooling the sintered molding to pulverize it.

A fourth method comprises, instead of mixing the starting powders, preparing coprecipitates of the starting powders, and subjecting the resulting coprecipitates to pyrolysis (chemical decomposition) at about 200° to 1,300° C. to form a thermally decomposed product. In accordance with this method the product may be cooled by simply allowing the product to stand in the air, however, the product is preferably rapidly cooled as in the second and third methods.

A fifth method comprises subjecting the product obtained in each of the above-mentioned methods to a chemical etching treatment.

In the above-described methods, the benefits of repeating the solid phase reaction or the sintering treatment are that the powder is more uniform and has a narrower size distribution, the separation of the powder into individual grains and the ability to collapse the powder are improved, and the size of individual grains is increased. Repetition two or three times suffices for most practical purposes.

The term "rapidly cooling" as used herein refers to various cooling procedures such as by placing the powders into various liquids, e.g., water; spraying water into a furnace containing the powders; blowing various gases, e.g., air, on the powders; and the like. The cooling rate achieved is generally about 10° C./min or more and preferably about 20° C./min or more.

Since the thus-obtained ferroelectric ceramic powders do not require any additional harsh crushing treatment for pulverization, they are not attended by the structural fractures present in powders so harshly treated as described hereinbefore.

The starting powders used in making the ferroelectric ceramic used in the present invention should be about 98 wt % or more, preferably about 99 wt % or more pure and have a particle size of about 5µ or less, preferably about 3µ or less, more preferably about 1µ or less.

It goes without saying that all of the microcrystals constituting the powders obtained by the above-described treatments are not single domain crystals. The formation of multiple domains in some proportion of the microcrystals results from contamination with impurities, structural distortion (e.g., defects in the lattice, imperfections in the layer structure, etc.), departures from the stoichiometric ratio, non-uniformity in the composition and/or external factors (e.g., heat and stress) and is unavoidable. However, experiments have confirmed that when additional domains occur in the microcrystals obtained in accordance with the present invention, the electric potential applied for polarization can force them into alignment with the electric field without disturbing the orientation of the ceramic powder. Consequently, the microcrystals prepared in accordance with the present invention exhibit single directionality and, as such, the pulverized products obtained by the above-described treatments are for convenience referred to as "virtually single domain" microcrystals. On the other hand, single crystals or ceramics pulverized by conventional means after preparation under applied heat possess structural fractures giving rise to numerous multiple domains and subsequent distortion. Consequently, orientation in the direction of the applied electric field is hardly observed. Thus, the expression "virtually single domain microcrystals" is not to be construed as being limited to the ideal situation in which the matter consists solely of microcrystals having only the one domain which cannot be prepared industrially, but rather is to be construed from the standpoint of the distinction between the above-described multiple domain microcrystals which are conventionally prepared and ground and those crystals prepared in the present invention.

The etching treatment of the fifth procedure described above renders the size of individual microcrystalline grains uniform, and also renders the shape thereof still more spherical. This effect is thought to result from the phenomena that an etching solution acts preferentially at the grain boundaries to remove impurities, foreign matter, defects in the crystal lattice and amorphous phases, most of which are present along the grain boundaries and, further, it makes secondary grains produced by melt adhesion dissociate and decompose into single grains. Impurities inevitably invade the ceramic powder in the preparation of starting materials and during grinding tend to deposit along grain boundaries, thus, they can be removed to advantage from the ceramic powder using an etching solution. In addition, the etching solution rounds the grain surfaces and dissolves super fine grains.

The etching effects can be further enhanced by carrying out a light, disaggregative grinding treatment, such as stirring the solution, during the etching treatment, and the etching time can be greatly reduced when etching is carried out at a high temperature, for instance, under boiling. In any case, the etching treatment is carried out such that the etching action is restricted to dissolution of impurities, dissymmetric phases, amorphous phases and super fine grains the removal of all of which is desired, and elution of crystal phases is repressed so that the piezoelectric characteristics are not reduced.

The above-described powdery treatment product, namely the ferroelectric ceramic powder comprising microcrystals having virtually single domains, can be mixed with a wide variety of polymers, molded in an arbitrary shape (for example, a sheet), subjected to a hardening treatment such as crosslinking or vulcanization and then polarized to prepare the piezoelectric composite material of the present invention.

Although the effective orienting or polarizing field acting upon the ceramic microcrystals is reduced to several tenths or several hundredths its strength when the crystals are in the polymer, orientation in the direction of the applied electric field is readily obtained with the microcrystals of the present invention because they are not attended by structural fractures which cause the generation of numerous multiple domains in the microcrystals due to the stress resulting from conventional pulverization. Consequently, they exhibit particularly high ferroelectric and piezoelectric properties as has been confirmed experimentally.

In addition, the single domain powder is accompanied by another advantage. The ceramic powder used in the present invention substantially does not contain fine particles having a particle size of about $1\mu$ or less, but is composed mainly of relatively coarse grains. Preferably the ceramic powder used in the present invention contains 90% or more of its grains in a particle size range of about 1 to $400\mu$. The composite material obtained by mixing such powders and a polymer is pliable and has excellent workability and as a result it is possible to sharply increase the amount of the single domain powder in the composite exceeding the mixing amounts possible with conventional powders. The increased mixing amount possible contributes to further improving the efficiency of the resulting composite material. On the other hand, due to the improvement in the orientation of the domains even mixing only a small amount of the virtually single domain powder with the polymer can impart remarkable piezoelectric effects. Therefore, soft pliable piezoelectric materials as well as simple body of rubber are possible.

Moreover, as pointed out earlier, the microcrystalline grains have a spherical shape as a result of the chemical etching treatments and therefore they are able to fit the polymers and voids almost disappear from the composite material, and the density of the composite material increases. By dissolving the super fine grains in the etching solution, composite materials possessing high plasticity, high fluidity and consequently, high workability, high density and high performance are possible. Further, it becomes possible to obtain very thin sheets of composite materials measuring $15\mu$ or so in thickness.

The chemically etched microcrystals do not have cleaved planes having sharp edges and/or sharp-pointed corners as observed in powders prepared with a conventional crushing and grinding treatments. Such being the case, the mechanical strength of the composite materials of the present invention is greatly enhanced and consequently, it becomes possible to provide piezoelectric composite materials suitable for use as mechanical force-electric energy transducers of a type which do not suffer from mechanical damages through repeated applications of mechanical forces such as impact or tension.

By taking advantage of the above-described properties of the composite materials obtained by compounding the ferroelectric ceramic powder comprising microcrystals having virtually single domains with a polymer, viz., excellent orientation in the direction of polarization, simple directionality and good workability, and properly selecting the mixing ratio and the nature of polymer to be employed, it becomes possible to provide piezoelectric composite materials having a wide variety of mechanical, electric and physical characteristics, selected for the purpose or the end-use of the composite material. For instance, in order to obtain a composite material useful as a transducer for living bodies which requires pliability enough to adapt oneself to the human body the mixing proportion of the polymer must be much larger than that of the ferroelectric powder, while in order to obtain the composite material useful as a keyboard switch in which a number of switches are integrated on a piezoelectric sheet, which does not require as much pliability as high piezoelectric properties, the mixing proportion of the ferroelectric powder is larger than that of the polymer. Moreover, applications to a wide variety of technical arts, for example, transformation of mechanical energy into electric energy, transformation of electric energy into sonic energy, preparation of pyroelectric materials and so on, will be expected in the future.

Meanwhile, in known piezoelectric sheets utilizing ceramic powders which cannot escape from generating multiple domains by receiving conventional crushing treatments, the ceramic powders cannot help being mixed in a large amount in order to achieve the required efficiency, because the polarizability thereof is inhibited to a great extent, as described hereinbefore. Therefore, the sheets prepared are hard, fragile and easily torn and therefore unfit for practical use at any stage of manufacturing. In the present invention, a high mixing ratio of ceramic to polymer is not always required and as a result the pliability of the polymer itself can be maintained to advantage while satisfactory high piezoelectric properties can be achieved.

As to mixing ratios of piezoelectric powders to polymeric substances, ratios below 1:9 (by volume) do not exhibit the effect of the ceramic powders. The piezoelectric property increases with an increase in the mixing ratio and a pronounced increase is observed in the ratio of 55:45 to 90:10. At ratios above 9:1 the fluidity and the workability of the composite deteriorates markedly and it actually becomes impossible to make moldings therefrom. Accordingly, mixing ratios of powder to polymeric substance ranging from about 1:9 to 9:1 are desirable for most practical uses.

The present invention is most effectively practiced using ferroelectric ceramic powders as described in B. Jaffe et al., *Piezoelectric Ceramics*, published by Academic Press, London and New York (1971), and more particularly using the following salts as ferroelectric ceramics.

1. Perovskite Structures (1) Barium titanate and solid solutions containing as the main component barium titanate, with specific examples including $BaTiO_3$, $(Ba, Pb, Ca)TiO_3$, etc.

(2) Lead titanate and solid solutions containing as the main component lead titanate, for example, $(Pb, La)TiO_3$, $PbTiO_3-BiFeO_3$, etc.

(3) Lead titanate zirconate and solid solutions containing this salt as the main component, for example, $PbZrO_3-PbTiO_3$, $PbZrO_3-PbSnO_3-PbTiO_3$, etc.

(4) Three-component ceramics consisting of solid solutions containing lead titanate zirconate and as a third component a salt of lead oxide and other metal oxides belonging, for example, to one of the following groups (a) to (f):

(a) Oxides represented by the formula of $A^{2+}(B_{\frac{1}{3}}^{2+}.B_{\frac{2}{3}}^{5+})O_3$ where $A^{2+}$ is Pb, Sr, or Ba; $B^{2+}$ is Zn, Cd, Mg, Ni, or Co; and $B^{5+}$ is Nb or Ta, with specific examples including $Pb(Ni_{\frac{1}{3}}.Nb_{\frac{2}{3}})O_3$, $Pb(Zn_{\frac{1}{3}}.Nb_{\frac{2}{3}})O_3$, $Pb(Co_{\frac{1}{3}}.Nb_{\frac{2}{3}})O_3$, $Pb(Mg_{\frac{1}{3}}.Nb_{\frac{2}{3}})O_3$, etc.

(b) Oxides represented by the formula of $A^{2+}(B_{\frac{1}{2}}^{2+}.B_{\frac{1}{2}}^{6+})O_3$, where $A^{2+}$ is Pb; $B^{2+}$ is Cd, Mn, Zn, Mg, Co, or Ni; and $B^{6+}$ is W or Te with specific examples including $Pb(Ni_{\frac{1}{2}}.W_{\frac{1}{2}})O_3$, $Pb(Co_{\frac{1}{2}}.W_{\frac{1}{2}})O_3$, etc.

(c) Oxides represented by the formula of $A^{2+}(B_{\frac{1}{2}}^{3+}.B_{\frac{1}{2}}^{5+})O_3$ where $A^{2+}$ is Pb, Ba, or Ca; $B^{3+}$ is Fe, Sc, Cr, Yb, Lu or In; and $B^{5+}$ is Nb or Ta with specific examples including $Pb(Fe_{\frac{1}{2}}.Nb_{\frac{1}{2}})O_3$, $Pb(Sb_{\frac{1}{2}}.Nb_{\frac{1}{2}})O_3$, $Pb(Y_{\frac{1}{2}}.Nb_{\frac{1}{2}})O_3$, etc.

(d) Oxides represented by the formula of $A^{2+}(B_{\frac{2}{3}}^{3+}.B_{\frac{1}{3}}^{6+})O_3$ where $A^{2+}$ is Pb; $B^{3+}$ is Fe; and $B^{6+}$ is W, with specific examples including $Pb(Fe_{\frac{2}{3}}.W_{\frac{1}{3}})O_3$.

(e) Oxides represented by the formula of $A^{3+}(B_{\frac{1}{2}}^{2+}.B_{\frac{1}{2}}^{4+})O_3$ where $A^{3+}$ is La or Nd; $B^{2+}$ is Mg; and $B^{4+}$ is Ti, with specific examples including $La(Mg_{\frac{1}{2}}.Ti_{\frac{1}{2}})O_3$ and $Nd(Mg_{\frac{1}{2}}.Ti_{\frac{1}{2}})O_3$.

(f) Oxides represented by the formula of $(A_{1-x}^{1+}.A_x^{3+})BO_3$ where $A^{1+}$ is Na or K; $A^{3+}$ is La, Ce, Nd or Bi; and B is Ti, with specific examples including $(Na_{\frac{1}{2}}.La_{\frac{1}{2}})TiO_3$, $(K_{\frac{1}{2}}.La_{\frac{1}{2}})TiO_3$, etc.

(5) Solid solutions containing $NaNbO_3$ as the main component, with specific examples including $NaNbO_3$, $(Na-K)NbO_3$, $Na(Ta-Nb)O_3$, etc.

2. Tungsten Bronze Structures

Representative examples include $PbNb_2O_6$, $PbNb_2O_6-PbTa_2O_6$, $PbNb_2O_6-BaNb_2O_6$ and the like.

3. Bismuth Layer Structures

Representative Examples include $Bi_4Ti_3O_{12}$, $Bi_4PbTi_4O_{15}$, $Bi_4Sr_2Ti_5O_{18}$ and the like.

4. Others $LiNbO_3$, $LiTaO_3$ and so on.

5. Those ceramics which contain as a basic composition the above one-, two- or three-component system, wherein a part of the Pb is replaced by an alkaline earth metal(s).

6. Those ceramics which contain as a basic composition the above-described component system, wherein the Pb component is present in excess of the stoichiometric amount.

7. Those ceramics which contain as a basic composition the above-described systems (containing $PbTiO_3$) and further, contain as a supplemental component(s) one or more of oxides selected from the following group I, II or III for the purpose of modification:

I. $Nb_2O_5$, $Ta_2O_5$, $La_2O_3$, $Sb_2O_5$, $Sb_2O_3$, $Bi_2O_3$, $WO_3$, etc.

II. $MgO$, $Fe_2O_3$, $Sc_2O_3$, $K_2O$, etc.

III. $Cr_2O_3$, $U_2O_3$, $MnO_2$, etc.

The composition of the ceramic powder employed is selected based on the end-use of the composite material from the above-described basic compositions and compositions analogous thereto, which may be modified by the partial replacement or the addition of certain supplemental components as shown in items 5 to 7 above, taking into account the peculiar properties of the respective compositions, because some compositions are excellent in ferroelectric properties, some compositions are excellent in piezoelectric properties and other compositions are excellent in pyroelectric properties.

Moreover, it becomes feasible to prepare piezoelectric composite materials possessing improved orientation in the direction of an applied field, which is brought about by controlling the grain size (particularly, excess PbO exhibits marked effect to the grain growth) and lowering the strength of anti-electric-field and on the contrary, raising the strength of anti-electric-field makes it possible for piezoelectric composite materials to have high resistance to static load and to have reduced variations with the lapse of time. Accordingly, the present invention can contribute to preparation of piezoelectric composite materials possessing a wide variety of characteristics suitable for various purposes or end-uses.

Specific examples of polymers suitable for compounding with the above-described ferroelectric ceramics particularly the ceramic powders comprising the microcrystals having virtually single domains include various rubbers (e.g., natural, synthetic and reclaimed rubber, or rubber blends thereof), particularly fluorine-containing rubber and chloroprene, and thermoplastic resins such as polyvinylidene fluoride (PVDF), acrylonitrile-butadiene-styrene copolymer (ABS), polyvinyl chloride (PVC), polyvinyl fluoride ($PVF_2$) and so on. Polymers having a volume resistivity of about $10^{10}$ ohm·cm or more at room temperature are preferred.

Etching solutions employable in the chemical etching procedure of the present invention may be general acid or alkaline solutions. However, the etching treatment should be carried out under such mild conditions that etching action is restricted to removal of distorted phases and amorphous phases and etching action which causes the elution of the Pb component from the crystal phase and the deterioration of piezoelectric properties is repressed.

Therefore, the etching treatment is carried out preferably using a dilute etching solution. The acid and alkali solutions are generally about 3 to 50 vol % with the pH of the acid solution being about 3 or less and the pH of the alkali solution being about 13 or more. Hydrogen peroxide ($H_2O_2$) can also be used as the etching solution.

If the etching treatment is carried out in a static condition it can take a very long time, such being the case, it is preferred to carry it out at a high temperature, for instance, under a boiling condition, or with stirring or with light grinding when it is carried out at an ordinary temperature from the standpoint of the reduction in time to a great extent. In addition, such an assistant action applied to the etching treatment as boiling, stirring or light grinding results in the advantage that edges of crystal grains become more roundish and the size thereof becomes more uniform through friction and abrasion among the grains.

Suitable etching acids include hydrochloric acid, nitric acid, acetic acid, sulfuric acid, phosphoric acid, hydrofluoric acid or mixtures thereof. Suitable examples of alkalis are sodium hydroxide, potassium hydroxide or mixtures thereof. Specific examples of standard etching conditions are set forth below in Table 1.

TABLE 1

| Ferroelectric Ceramic Powder | Etching Solution | Concentration (vol %) | Temperature | Time (hr) | Condition |
| --- | --- | --- | --- | --- | --- |
| Pb(Zr—Ti)$O_3$ (solid solution) | HCl | 10 | Room Temp. | 3-40 | Mechanical Stirring |
|  | $HNO_3$ | 10 | Room Temp. | 1-15 | Mechanical Stirring |
|  | $CH_3COOH$ | 50 | Room Temp. | 8-100 | Mechanical Stirring |
| $PbTiO_3$ | HCl | 10 | Room Temp. | 3-40 | Mechanical Stirring |
|  | $HNO_3$ | 10 | Room Temp. | 1-15 | Mechanical Stirring |
|  | $CH_3COOH$ | 50 | Room Temp. | 8-100 | Mechanical Stirring |

By increasing the etching temperature the time required for completion of etching may be reduced. The above-described etching treatment is preferably carried out using 100 g of an etching solution for 100 g of a ferroelectric ceramic powder under conditions such as those described above.

The composite material of the present invention can be polarized at about 15° C. to the softening point of the polymer in about 1 second to 48 hours using an electric field strength of about 10 to 300 KV/cm.

The characteristics of the efficiency and the workability of the piezoelectric polymer composite materials prepared in the present invention depend upon the size distribution of the ceramic powder used. Therefore, the size distribution should be prescribed as follows in order to achieve practically the objects of the present invention.

The proportion of fine powder having a diameter of 0.2$\mu$ or less should be limited to less than several percent (e.g., about 3% or less), while the proportion of coarse grains having diameters of 4x or more, where x is the average diameter and fixed so as to fall in the range of about one-tenth to one-three-hundredth of the thickness of the sheet to be prepared, should be as small as possible. The particle size can be controlled by adjusting temperature, retention time, atmosphere, composition, additives and other factors. In particular, one means of controlling the particle size is by adding PbO to the system generally in amounts of about 0.1 to 20 parts by weight per 100 parts by weight of the composition as illustrated in detail in Example 9 below.

Such a particle size control is also useful for the improvement in durability of piezoelectric sheet, because the presence of hard coarse grains dispersed in the polymer causes internal damage when stress is applied externally to the sheet manufactured.

The present invention will now be illustrated in greater detail by reference to the following examples.

EXAMPLE 1

A commercial PbO powder having an average particle size of 2$\mu$ or less and a purity of 99% or higher, and a commercial $TiO_2$ powder having a purity of 98% or higher were combined in equimol amounts. The powders were chosen such that the weight average of their purities fell above 99%. The resulting combination was put in a vibrational mill whose inner wall was coated with a polyurethane resin with the intention of protecting the contents from being contaminated with impurities, and mixed using a medley of alumina spherulite and pebbles for 5 hours. 200 g portions of the resulting mixture were taken out of the mill and then each was shaped under applied pressure of 50 kg/cm$^2$ in the form of a tablet having an outside diameter of 60 mm and a thickness of 20 mm using the respective molds. The thus-obtained tablets were heated at a temperature of 1,050° C. over a period of 4 hours in an atmosphere of PbO using a high aluminous crucible and thereby a solid phase reaction was accomplished resulting in the formation of $PbTiO_3$.

One of the resulting product samples was immediately taken out of the furnace and thrown into water in order to cool the sample rapidly to pulverize it. The product was pulverized by the rapid cooling to provide sample A, a virtually single domain powder.

Another of the resulting product samples was left in the furnace till the temperature thereof reached room temperature and then it was ground to a coarse powder using a mortar. The grinding was carried out cautiously so as to limit contamination to a minimum extent and subsequently, it was subjected to further grinding under a wet condition in an aluminous ball mill having a volume of 2 liters with the aid of 300 g of a medley of alumina grains and pebbles over a period of 16 hours. Thus, a multiple domain powder product pulverized by grinding which was obtained to provide Sample B. Size distributions of the powder A and B are shown in the FIG. 1 by the marks ● and ×, respectively.

In addition, as to the powder A, pulverization can be further promoted by stirring at the time of rapid cooling. Such a promotion takes place to advantage in the case also of rapid cooling carried out in water after the product is left in a furnace for a while.

Figure 2A:
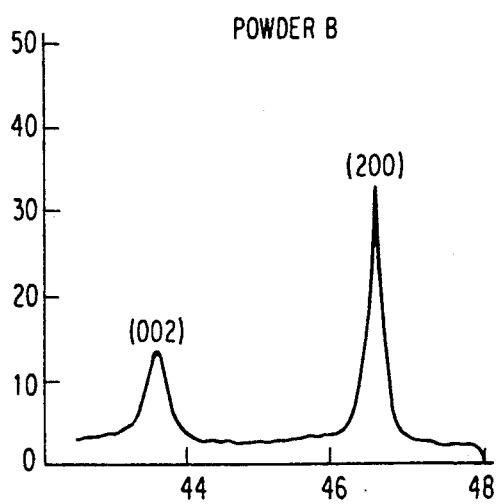
FIG. 2 is the X-ray diffraction patterns of both ferroelectric ceramic powders prepared by the present method and by a conventional method.
Figure 2B:
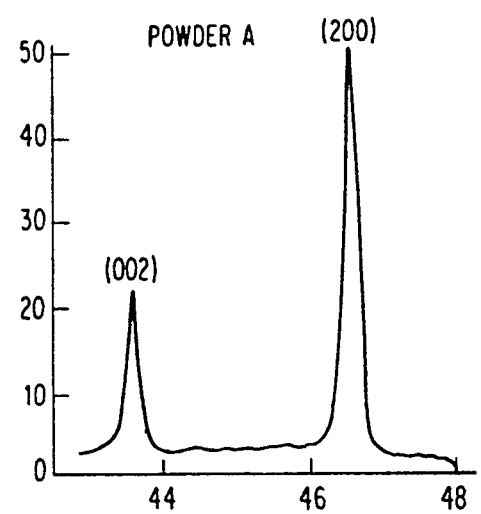

X-ray diffraction patterns of the powders A and B having average diameter of 3$\mu$ were measured using copper as a target, nickel as a filter, a working voltage of 35 KV and a current of 20 mA. The full scale was 2,000 cps, the time constant was 2 seconds, the goniometer speed was 0.5°/min, the divergent slit was 1°, the scatter slit was 1°, and the image receiving slit was 0.3 mm. It is apparent from the FIG. 2 that both peaks corresponding to (200) and (002) of the single domain powder A have narrower half widths than those of the multiple domain powder A.

Separately, a fluororubber was prepared by combining 100 parts by weight of Dai-el G501 (manufactured by Daikin Kogyo Co., Ltd.) and 3 parts by weight of a vulcanizing agent, an amine system (V-3, Daikin Kogyo Co., Ltd. Main component: hexamethylene diamine) and then by dissolving the resulting combination into a suitable amount of acetone.

Each of the single domain powder A and the multiple domain powder B was mixed with the above-described fluororubber in a ratio of the volume of the fluororubber to that of the powder of 2:3, and stirred thoroughly using a kneader, followed by natural drying. The dried matter was further kneaded using an oven roll and subsequently, subjected to rolling to obtain a ceramic rubber sheet having a thickness of 0.5 mm.

Next, 200 parts by weight of carbon black was added to 100 parts by weight of the fluororubber prepared in the same manner and then they were kneaded and rolled to make a covering rubber sheet 0.2 mm thick. The thus-obtained covering sheets were stuck to both sides of the above-described ceramic rubber sheet and then the resulting laminate was subjected to a vulcanizing treatment over a period of 1 hour at 200° C. and an applied pressure of 10 kg/cm², resulting in the formation of a square sheet sample having a thickness of 0.5 mm, a length of 15 mm and a width of 15 mm.

Each of the thus-obtained sheet samples was soaked in silicone oil at 100° C., and a DC potential of 100-150 KV/cm was applied thereto for 30 minutes in order to polarize the sheet. The changes in the output potential generated by responding to the stress caused by rigid balls falling from various heights were measured under the condition described below.

Namely, the piezoelectric rubber sheet was put on an iron plate 10 mm thick, and a rubber plate 25 mm long, 25 mm wide and 2.0 mm thick was superposed upon the piezoelectric sheet as a buffer and adhered thereto using the adhesives of epoxy system under applied pressure. A rigid ball having an outside diameter of 14.3 mm and a weight of 11.87 g was allowed to fall from a given height H onto the laminate prepared above, and the resulting output potential was read on a synchroscope. The same measurement was repeated 5 times and thereby the average value was determined. The results of measurements are shown in Table 2. In addition, the piezoelectric constants of the piezoelectric rubber sheets of the present invention are set forth corresponding to the relative permittivity thereof in Table 2. As to how the piezoelectric constant is calculated, illustration will be given hereinafter in a lump.

TABLE 2

|  | Powder A | Powder B |
| --- | --- | --- |
| Ratio of PbTiO₃ to Fluororubber (by volume) | 3:2 | 3:2 |
| Ratio of PbTiO₃ to Fluororubber (by weight) | 100:15 | 100:15 |
| Output Potential (V) Generated by the Falling of Ball | | |
| H = 10 cm | 8.5 | 2.0 |
| H = 100 cm | 54 | 15 |
| Relative Permittivity $\epsilon/\epsilon_0$ | 42 | 32 |
| Piezoelectric Output Constant* | 142 | 40 |
| Remarks | Example | Comparison |

*$g_{31}$ ($\times 10^{-3}$ V-m/N)

A remarkable improvement in the piezoelectric power of the powder A prepared by the method of the present invention is apparent from the comparison with conventional powder B.

Moreover, each of the samples employed in the measurements of output potential generated by the falling of a ball was irradiated on and off with infrared rays, and the potential generated by thermal changes caused by such irradiation was observed on a synchroscope. In case of the powder A, the potential generated was 18 mV, while it was 7.5 mV in case of the powder B. It becomes clear that the sensitivity of the powder A to heat is 2.4 times that of the powder B and therefore the single domain powder is superior in pyroelectric properties also.

EXAMPLE 2

Figure 3:
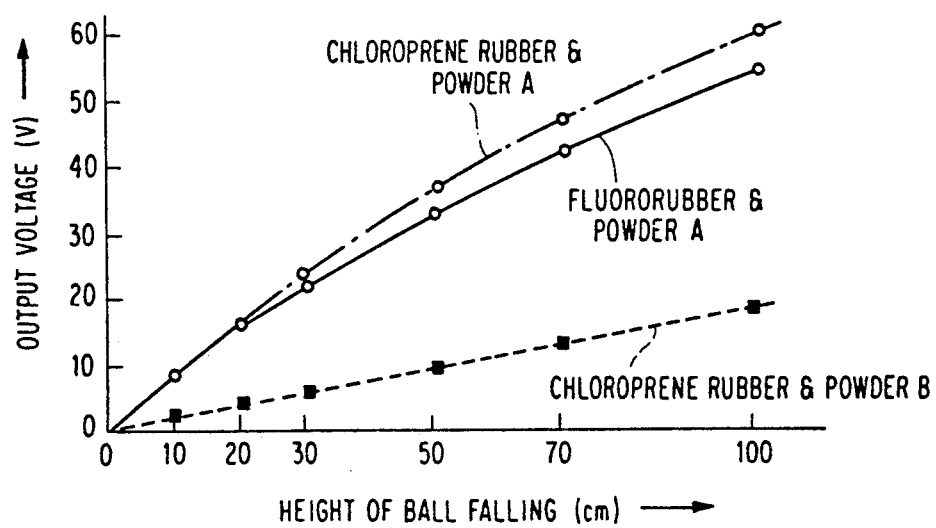
FIG. 3 is a graph of the relationship between the ball falling height and the output potential generated in the composite material of the present invention.

The single domain powder A prepared by the method of the present invention and chloroprene rubber were mixed in a ratio by volume of 3:2 and subsequently the mixture received the same treatments as in Example 1. The thus-obtained piezoelectric rubber sheet was examined in the same manner as in Example 1. In addition, the influence of the mixing ratio of chloroprene on the piezoelectric properties was examined by varying the ratio. The results obtained are set forth in Table 3, and the changes in the output potential with increasing height at the time of the falling of the ball are illustrated graphically in FIG. 3 as to the samples prepared in this example and the sample prepared in Example 1.

In each mixing ratio, the rubber sheet containing the powder A prepared according to the method of the present invention generated an output potential higher than those prepared using conventional powders by a factor of 3 to 4 and exhibited permittivity greater than the samples containing conventional powders by a factor of about 1.1 to about 1.3. Accordingly, since high piezoelectric property can be imparted to the rubber sheet even in the case that rubber is mixed in a much larger amount and consequently the resulting sheet is pliable, it becomes possible to manufacture novel soft materials possessing high piezoelectric properties with ease.

Thus, pliable combinations containing rubber in large amounts may be selected for the purpose of the manufacture of detecting elements suitable for human body (for example, a sphygmomanometer, a cardiac sound meter, a sphygmometer and so on), and the combinations exhibiting excellent output sensitivity which contain piezoelectric ceramic powders in large amounts should be selected for the purpose of the manufacturing of piezoelectric keyboard adhered to a printed base plate by application of heat, and the like. Thus, composite piezoelectric materials having mechanical, electric and physical characteristics suitable for a wide variety of usages can be provided to advantage.

Further, variations in the piezoelectric constant $d_{31}$ and the permittivity with the lapse of time under the condition of room temperature, dipping in water or high humidity were examined with respect to each of piezoelectric rubber sheets prepared in Examples 1 and 2. Therein, any changes were hardly found out even after the lapse of 1,000 hours and thereby markedly high stability is confirmed.

Furthermore, the durability was tested using an electromagnetic impact tester set at 30 mV or 5 V. In each case, any deterioration was not observed even after 1,000 times repetition of the impact test.

TABLE 3

|  | Powder A | | | | | Powder B | | |
| --- | --- | --- | --- | --- | --- | --- | --- | --- |
| Mixing Ratio of Powder to Rubber (by volume) | 3:2 | 1:9 | 1:1 | 7:3 | 4:1 | 3:2 | 1:9 | 4:1 |
| Amount (parts by weight) per 100 Parts by Weight | 10 | 140 | 15 | 6.6 | 3.8 | 10 | 140 | 3.8 |

TABLE 3-continued

|  | Powder A | | | | | Powder B | | |
| --- | --- | --- | --- | --- | --- | --- | --- | --- |
| of the Powder | | | | | | | | |
| Output Potential Generated by Falling of Ball (1.87 g) (V) | | | | | | | | |
| H = 10 cm | 10 | 0.6 | 6.0 | 12 | 10 | 2.3 | 0.15 | 2.4 |
| H = 100 cm | 60 | 3.9 | 35 | 72 | 74 | 17 | 0.96 | 19 |
| Relative Permittivity ($\epsilon/\epsilon_0$) | 35 | 9.5 | 24 | 46 | 52 | 28 | 12 | 42 |
| Piezoelectric Output Constant $g_{31}$ ($\times 10^{-3}$ V-m/N) | 149 | 24 | 117 | 154 | 158 | 45 | 6 | 37 |

EXAMPLE 3

Polyvinylidene fluoride (PVDF) was employed as a polymer. The single domain powder A and the multiple domain powder B described in Example 1 were mixed with PVDF in a mixing ratio by volume of 3:2 and dissolved in acetone. After evaporation of acetone, the mixture was kneaded with an oven roll at a temperature of 170°–180° C. and rolled to make a sheet 0.05 mm thick. The sheet was cut into small samples having a width of 100 mm and a length of 150 mm.

Figure 4:
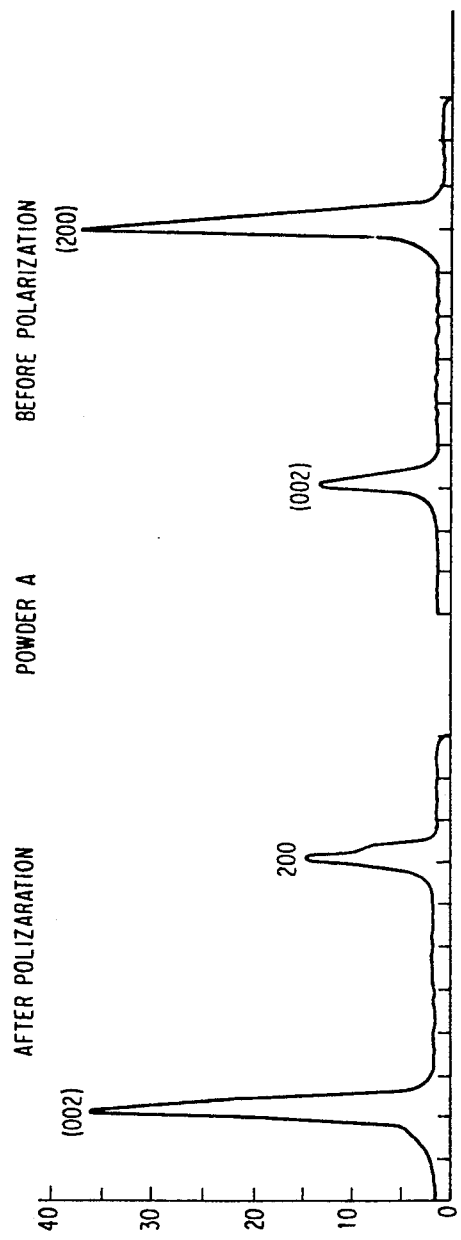
FIGS. 4 and 5 are each X-ray diffraction patterns before and after polarizing of ceramic powders incorporated into the piezoelectric rubber sheets, in which the polarization effect upon a virtually single domain microcrystalline powder of the present invention is compared with that for a powder obtained by a mechanical crushing treatment.
Figure 5:
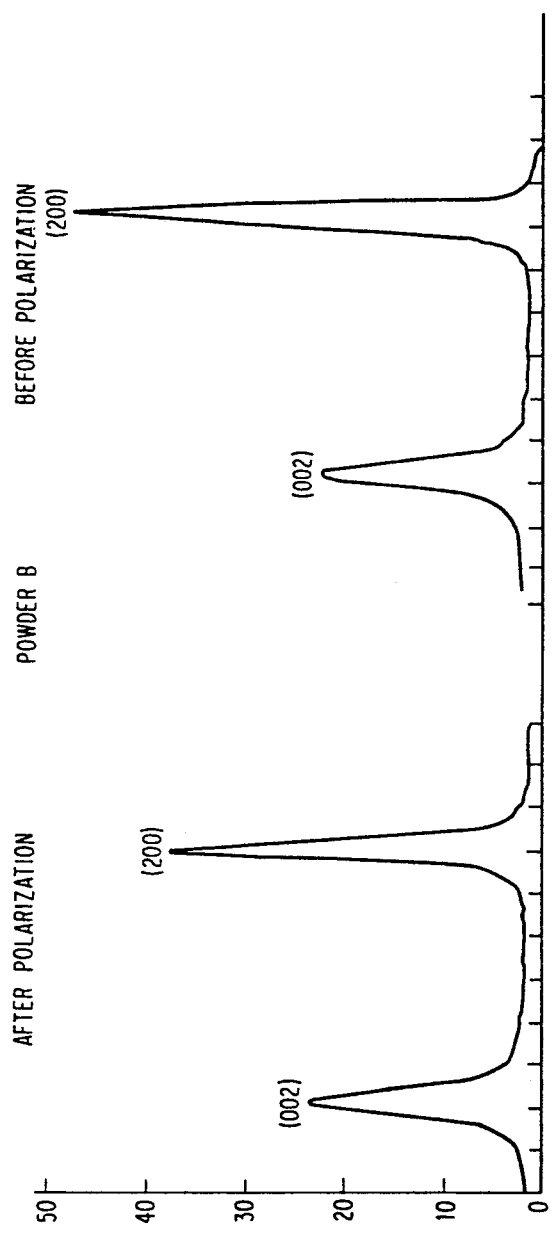

The intensities of X-ray diffraction from the (200) and (002) planes, respectively, were measured with respect to one side of the sample sheet. Next, silver deposit electrodes were formed on both sides of the sample sheet by evaporating silver in a thin layer onto the sample sheet and the resulting sheet was soaked in silicone oil of 100° C. Thereto, a D.C. potential of 150 KV/cm was applied over a period of 1 hour to polarize the sample. Then, the intensities of X-ray diffraction from the (200) and the (002) planes of the polarized sample were measured. The results are illustrated in FIGS. 4 and 5. On the basis of these data, the intensity ratio of X-ray diffraction from C-plane I(002)/I(002)+I(200) was calculated. Then, an increment (%) of the domain along the direction of the electric field applied due to polarization was calculated. The results are set forth in Table 4. In Table 4, the values of half widths of peaks assigned to (200) plane are also set forth.

TABLE 4

| Powder | Half Width of (200) Peak | Average Size (μ) | I(002)/I(002) + I(200) | | Increase* |
| --- | --- | --- | --- | --- | --- |
| | | | Before Polarization | After Polarization | |
| A | 15.5 | 3.0 | 0.25 | 0.71 | 0.46 |
| B | 24.5 | 3.0 | 0.31 | 0.38 | 0.07 |

*Upon orientation of domains in the direction of electric field through polarization.

Before polarization, it is expected that the orientation of the C-axis is distributed in each of the X, Y and Z directions with the same probability. Thus, the probability of orientation in the direction of thickness is essentially one-third. However, in both sample sheets containing the powder A and B, respectively, lower intensity ratios were observed. It is thought that orientation in the direction parallel to a rolling plane takes place at the time of calendering. Irrespective of the reason, in the case of the sample sheet containing the single domain powder A the intensity ratio moved from 0.25 to 0.71 before and after polarization. On the other hand, in case of the sample sheet containing the multiple domain powder B, no appreciable improvement in orientation of domains takes place. Namely, the structural fracture is caused by a grinding treatment and therefrom the formation of multiple domains and subsequent distortion result. When ferroelectric ceramic powders containing structural fractures are mixed with polymers, orientation of domains, namely polarizability, is broken in the resulting composite material. The expected piezoelectric properties cannot be attained.

Next, each of the above-described sample sheets was cut into small rectangular sheets having a width of 20 mm and a length of 70 mm, and the electric capacity of each sheet was measured using a universal bridge of 1 V and 1 KHz. From the data obtained, relative permittivity of each sheet ($\epsilon/\epsilon_0$, $\epsilon_0 = 8.854 \times 10^{-12}$ F/m) was determined.

Moreover, 45 g of a weight was applied to each of sample pieces and thereto a sine wave having frequency of 40 Hz and amplitude of 100 V/mm was further applied. The elongation caused by such stress in each sample pieces was measured using a differential balance and therefrom the piezoelectric strain constant $d_{31} = t/V \times \Delta l/l$ (m/V) was determined. Further, the piezoelectric output constant $g_{31} = d_{31}/\epsilon_0 \cdot \epsilon$ (V−m/N) was determined using the $d_{31}$ value obtained. The results are set forth in Table 5.

TABLE 5

| | Powder A | Powder B |
| --- | --- | --- |
| Relative Permittivity $\epsilon/\epsilon_0$ | 50 | 35 |
| Piezoelectric Strain Constant $d_{31}$ | 31.1 | 2.7 |
| Piezoelectric Output Constant $g_{31}$ | 71 | 11.4 |

In the calculation of the piezoelectric constant, t is the thickness (m) of a piezoelectric sheet, V is the applied potential (V), l is the length of a piezoelectric sheet (m), and Δl is the elongation in the direction of the length caused by application of potential (m).

It is apparent from the data in the table that the piezoelectric sheet of the present invention wherein the polarization of domains was oriented in the direction of applied electric field with the intensity ratio of 0.71 (refer to Table 4) possessed a relative permittivity higher than that of the sheet for comparison by a factor of about 1.4 and piezoelectric constants, both $d_{31}$ and $g_{31}$, larger than those of the sheet for comparison by a factor of about 5.5 to about 6 and therefore most of the domains could be nearly oriented in the direction of polarization field to result in the remarkable improvement in the piezoelectric properties.

In the sheet for comparison, orientation in the direction of electric field applied took place only to the extent of 0.07 on the basis of intensity ratio even when a high voltage of 150 KV/cm (nearly the maximum potential the sheet is capable of withstanding). Accordingly, the piezoelectric properties are low and the effect resulting from the mixing of the ceramic powder is virtually absent. It is thought that this is because individual ceramic powdery grains cause the structural fracture due to the stress resulting from the grinding treatment to generate multiple domains and subsequent distortion and therefore the resulting multiple domains could be hardly oriented in the direction of the applied electric field.

In each of the above-described examples, an embodiment of the present invention is illustrated with respect to the case that the ceramic powder consisting essentially of single domain microcrystals of the ferroelectric ceramic represented by the formula $PbTiO_3$ is employed, wherein a tentative molding obtained by mixing under a dry condition is forced to undergo a solid phase reaction under applied heat and then cooled rapidly to obtain a pulverized product. It was thus proved that such an embodiment was employed to advantage for achieving the objects of the present invention. On the other hand, the present invention can also be employed to advantage in cases that the ferroelectric solid solutions of $Pb(Ti-Zr)O_3$ system and the ferroelectric ceramic powder of $BaTiO_3$ system are used.

Namely, the solid solutions of the $Pb(Zr-Ti)O_3$ system transform from the rhombohedral system or the tetragonal system into the cubic system in the temperature range of 230° C. to 490° C., depending upon their respective compositions, and $BaTiO_3$ also undergoes a similar transformation at a temperature in the vicinity of 120° C., in analogy with the case of $PbTiO_3$ in which the similar transformation in the crystal form takes place at a temperature in the vicinity of 490° C. In the temperature range beyond the above-described respective temperatures, the so-called Curie transformation takes place and results in disappearance of the ferroelectric properties. Therefore, the above-described ferroelectric substances can be easily disintegrated and pulverized by conferring a sharp temperature drop across the transformation point thereupon. In case that the axial ratio (c/a) of the tetragonal crystal is large, such as $PbTiO_3$ (c/a=1.06), the disintegration and subsequent pulverization take place in a proportion near 100% by only one rapid cooling, as described hereinbefore. On the other hand, in the case of $Pb(Ti_{0.5}-Zr_{0.5})O_3$ the ratio c/a is about 1.02, and in the case of $BaTiO_3$ also it shows a similar value. Therefore, the pulverization takes place merely in a proportion of 50% or so with only one rapid cooling. However, even in such cases, ferroelectric ceramic powders consisting of virtually single domain microcrystals can also be prepared with the aid of the repetition of rapid cooling and optionally, a gentle grinding treatment for a short time, by analogy with $PbTiO_3$.

Moreover, microcrystals having virtually single domains can be prepared more easily by various processes. For example, one process includes the steps of molding tentatively the powder having once received the solid phase reaction treatment, sintering the resulting molding and cooling rapidly. Another process includes the steps of forcing a tentative molding obtained under a dry or a wet condition to undergo the solid phase reaction under applied heat or sintering the tentative molding, grinding it to a powder, repeating the solid phase reaction or the sintering treatment at a temperature equal to or higher than that of the first time and finally subjecting the product to rapid cooling to pulverize it. Still another process includes the steps of repeating the solid phase reaction of powders under applied heat two or more times, stirring or grinding moderately the product in water to dissociate it, and repeating the above-described steps several times.

Regarding the size of the grains of the pulverized products prepared according to the above-described processes, the particle size control in the range of about 0.1 to $400\mu$ is possible through the selection of proper conditions in connection with the preparation parameters, for example, temperature, retention time, atmosphere, composition, additives and so on.

EXAMPLE 4

Next, another embodiment of the present invention is illustrated with respect to $Pb(Ti-Zr)O_3$ solid solution.

A commercially available PbO powder having an average size of $2\mu$ or less and a purity of 99% or higher, a commercially available $TiO_2$ powder having a purity of 98% or higher and a commercially available $ZrO_2$ powder having a purity of 98.5% or higher were combined in amounts corresponding to the composition of $Pb(TiO_{0.5}-Zr_{0.5})O_3$, wherein the oxides were selected such that the weight average of their purities fell above 99%. A 25 kg portion of the resulting combination was mixed over a period of 5 hours under a dry condition using a vibrational mill. In order to protect the contents from being contaminated with impurities, the inner wall of the vibrational mill was coated with a polyurethane resin, and a medley of alumina spherulite and pebbles was employed.

The product was shaped in the form of tablet having an outside diameter of 40 mm and a thickness of 10 mm under applied pressure of 50 kg/cm$^2$ with the aid of a mold. The thus-obtained tablet was heated at a temperature of 1,100° C. over a period of 4 hours in an atmosphere of PbO using a high alumina crucible and thereby a solid phase reaction was performed resulting in the formation of $Pb(Ti_{0.5}-Zr_{0.5})O_3$.

The resulting product was immediately thrown into a water tank filled with chilled water, and stirred with a propeller style stirrer for 30 minutes for the purpose of acceleration of disintegration and subsequent pulverization. Thus, the product finely pulverized in a proportion of about 50% was obtained.

The thus-obtained pulverized product was dried at a temperature of 130° C. for 5 hours to provide the single domain powder C.

On the other hand, the product prepared in the same solid phase reaction process was left in the furnace until the temperature thereof reached about room temperature. Then it was ground to a coarse powder using a mortar. The grinding was carried out cautiously so as to avoid contamination with impurities as much as possible. The thus-obtained roughly pulverized material (200 g portion) was subjected to further grinding under a wet condition in an aluminous ball mill having a volume of 2 liters with the aid of 300 g of a medley of alumina grains and pebbles for 16 hours and dried in a similar manner. This pulverized product is a multiple domain powder hereinafter referred to as powder D.

Size distribution curves of both powders C and D are shown in FIG. 1 using marks Δ and o, respectively.

Each of the powders C and D and the fluororubber were mixed in a volumetric ratio of 3:2 and therefrom piezoelectric rubber sheets were prepared in the same manner as in Example 1 and examined for their piezoelectric properties. The results obtained are set forth in Table 6.

TABLE 6

|  | Powder C | Powder D |
|---|---|---|
| Output Potential (V) Generated by Falling of Ball |  |  |
| H = 10 cm | 2.5 | 0.9 |
| H = 100 cm | 26 | 5.5 |
| Relative Permittivity $\epsilon/\epsilon_0$ (at 1 KHz) | 77 | 55 |
| Piezoelectric Constants |  |  |
| $d_{31}$ ($\times 10^{-12}$ m/V) | 55.9 | 8.0 |
| $g_{31}$ ($\times 10^{-3}$ V·m/N) | 82 | 16.4 |
| Average Grain Size ($\mu$) | 3.10 | 1.23 |

Figure 6:
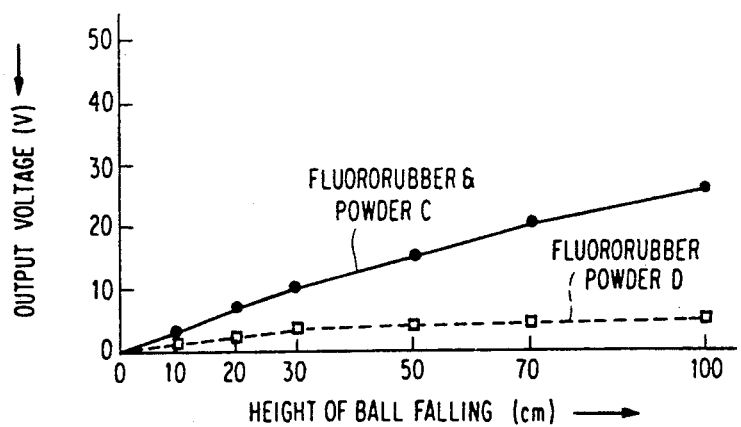
FIG. 6 is a graph clarifying the relationship between the ball falling height and the output potential generated in each of the composite materials containing as a ceramic powder $Pb(TiZr)O_3$ prepared separately by the method of the present invention and a conventional method.

In addition, in FIG. 6 the output potential is plotted for various heights from which the ball falls onto each of the piezoelectric rubber sheets.

EXAMPLE 5

A commercial PbO powder having an average size of $2\mu$ or less and a purity of 99% or higher, a commercial $WO_3$ powder having an average size of $2\mu$ or less and a purity of 99% or higher, a commercial $ZrO_2$ powder having a purity of 98.5% or higher and a commercial $TiO_2$ powder having a purity of 98% or higher were combined in their respective amounts corresponding to the composition of the ceramic powder desired to prepare, $Pb(Ti_{0.5}-Zr_{0.5})O_3 + 1$ wt % $WO_3$. The powders were chosen so that the weight average of their purities was above 99%, and mixed in the same manner as in Example 4.

The mixed powders were put in a high aluminous crucible without shaping treatment and heated for 4 hours under an atmosphere of PbO in a crucible maintained at 950° C. and thereby a solid phase reaction was accomplished to prepare $Pb(Ti_{0.5}-Zr_{0.5})O_3$ containing about 1 wt % $WO_3$.

The resulting solid mass was placed in a mortar by tapping thereon using a pestle and then passed through a 60 mesh screen. The residue was further ground gently. The resulting sieved powder was called powder E. A portion of powder E was shaped in a form of tablet of 40 mm in diameter and 10 mm thick under applied pressure of 50 kg/cm², and sintered at a temperature of 1,050° C. over a period of 6 hours in an atmosphere of PbO. The sample was immediately thrown into water directly from the furnace to obtain a pulverized product, powder F. Powder F was stirred with a propeller style stirrer for 30 minutes. Thus, a finely pulverized product in a proportion of about 60% was obtained.

The residue obtained at the time of sieving was subjected to a repetition of rapid cooling or grinding for a short time to readily produce a powder having properties similar to those of the powder F. Therefore, such a powder also was used as the powder F. Further, the powder F was subjected to the same grinding treatment under a wet condition as described in Example 1 for 16 hours to prepare the pulverized product. The resulting pulverized product was labelled powder G. Each of powders E, F and G, and the fluororubber were mixed in a volumetric ratio of 3:2 and therefrom piezoelectric sheets were prepared in the same manner as in Example 1. The piezoelectric properties of these sheets are shown in Table 7.

TABLE 7

Preparation Summary
Mixing Ratio (by volume):
Piezoelectric Ceramic Powder: Fluoroubber = 3:2
Composition of Piezoelectric Ceramic Powder:
$Pb(Zr_{0.50}-Ti_{0.50})O_3 + 1$ wt % of $WO_3$
Pulverizing Process:

Powder E: Solid phase reaction in a powdery state.
Powder F: Solid phase reaction in powdery state--Tentative molding--Sintering--Rapid cooling.
Powder G: Solid phase reaction in powdery state--Grinding under wet condition (16 hrs)

Piezoelectric Properties

|  | Powder E | Powder F | Powder G |
|---|---|---|---|
| Output Potential (V) Generated by Falling of Ball |  |  |  |
| H = 10 cm | 3.1 | 5.3 | 1.0 |
| H = 100 cm | 24 | 40 | 6.1 |
| Relative Permittivity $\epsilon/\epsilon_0$ (at 1 KHz) | 55 | 60 | 51 |
| Piezoelectric Constants |  |  |  |
| $d_{31}$ ($\times 10^{-12}$ m/V) | 25.8 | 43.6 | 9.2 |
| $g_{31}$ ($\times 10^{-3}$ V·m/N) | 53 | 82 | 20.3 |

Powder E obtained through only the solid phase reaction and Powder F obtained through successive solid phase reaction, sintering and rapid cooling generated output potentials higher than that of the multiple domain powder G by factors of about 4 and about 6.6, respectively, when the ball fell from a height of 100 cm, and exhibited piezoelectric constants $d_{31}$ higher than that of the powder G by factors of 2.8 and 4.7, respectively. Therein, remarkable improvements in piezoelectric properties were observed.

The superiority of the powder F to the powder E is attributable to the further growth of the grains of piezoelectric microcrystals, and to the more homogeneous mixing thereof with a polymer, which results from the disintegration and dissociation of giant secondary grains, which grains are formed by fused adhesion among grains, through rapid cooling, namely such a situation that individual grains are independent of one another.

Next, each of the powders E, F and G was mixed with polyvinylidene fluoride (PVDF) in a volumetric ratio 3:2 and therefrom piezoelectric sheets were prepared in the same manner as in Example 5 and tested. The results obtained are set forth in Table 8.

TABLE 8

|  | Powder E | Powder F | Powder G |
|---|---|---|---|
| Relative Permittivity $\epsilon/\epsilon_0$ | 92.7 | 104 | 73.7 |
| Piezoelectric Constants |  |  |  |
| $d_{31}$ ($\times 10^{-12}$ m/V) | 25.5 | 65.9 | 9.5 |
| $g_{31}$ ($\times 10^{-3}$ V·m/N) | 31.1 | 71.4 | 14.6 |

Analogously to the above-described cases, the single domain powders E and F provided excellent permittivity and the piezoelectric constants, $d_{31}$ and $g_{31}$, compared with the multiple domain powder G, and of the single domain powders, the powder F which was prepared by the solid phase reaction, molding tentatively, sintering and cooling rapidly exhibits more excellent piezoelectric properties than the other powder.

EXAMPLE 6

A commercial PbO powder having an average particle size of $2\mu$ or less and a purity of 99% or higher, a commercial $WO_3$ powder having an average particles size of $2\mu$ or less and a purity of 99% or higher, commercially available $ZrO_2$ having a purity of 98.5%, commercially available $TiO_2$, NiO, $SrCO_3$ and $Ta_2O_5$ having purities of 98% or higher were combined in amounts corresponding to the composition of the ceramic powder $(Pb_{0.95}\text{-}Sr_{0.05})$ $[(W_{\frac{1}{2}}\text{-}Ni_{\frac{1}{2}})_{0.15}\text{-}Zr_{0.425}\text{-}Ti_{0.425}]O_3 + 4$ wt % of $Ta_2O_5$. The starting materials were chosen so that the weight average of their purities was above 99%, and mixed in the same manner as in Example 4.

The mixed powders were put in a high aluminous crucible without a shaping treatment, and heated for 4 hours under an atmosphere of PbO in the crucible maintained at 850° C. and thereby a solid phase reaction was performed to prepare the solid solution ceramic powder of three-component system containing as the third component a composite perovskite compound, $(Pb_{0.95}\text{-}Sc_{0.05})$ $[(W_{\frac{1}{2}}\text{-}Ni_{\frac{1}{2}})_{0.15}\text{-}Zr_{0.425}\text{-}Ti_{0.425}]O_3$, which contained additionally about 4 wt % of $Ta_2O_5$.

The resulting solid mass was placed in a mortar, ground gently to a coarse powder and then subjected to a grinding treatment under a wet condition over a period of 16 hours as in Example 1. The thus-obtained powder was dehydrated using a filter press, dried by heating and then ground roughly into a powder using a pestle. The resulting solid mass was put in a high aluminous crucible and heated for 4 hours under an atmosphere of PbO in the crucible maintained at 1,000° C. to sinter the solid mass. At the conclusion of sintering, the resulting solid mass was immediately taken out of the crucible and then thrown into water to collapse and pulverize the sample. The powder obtained by such rapid cooling was stirred with a propeller style stirrer for 30 minutes to produce the product finely pulverized in a proportion of about half.

The resulting unpulverized portion was further subjected to a pulverizing treatment such as the repetition of rapid cooling or gentle grinding and thereby it was readily pulverized. The thus-obtained powder had the same properties as the first-formed powder. Therefore, the first-formed powder and the second-formed powder were employed in combination as the single domain powder H.

On the other hand, after the conclusion of sintering at 1,000° C. a portion of the resulting solid mass was left in the crucible till the temperature thereof reached about room temperature and then ground to a coarse powder and subjected to the same grinding treatment under a wet condition as described in Example 1 over a period of 16 hours to pulverize it. The thus-obtained multiple domain powder is referred to as powder I.

Each of powders H and I was dried and mixed with polyvinylidene fluoride (PVDF) in a mixing ratio (by volume) of 3:2. Each was processed in the same manner as described in the preceding examples and examined for piezoelectric properties. The results obtained are set forth in Table 9.

TABLE 9

|  | Powder H | Powder I |
|---|---|---|
| Relative Permittivity $\epsilon/\epsilon_0$ | 100 | 71 |
| Piezoelectric Constants |  |  |
| $d_{31}$ ($\times 10^{-12}$ m/V) | 47 | 12 |
| $g_{31}$ ($\times 10^{-3}$ V-m/N) | 53.1 | 19 |

Analogous to the above-described ferroelectric ceramic powders of a one component system and $PbTiO_3\text{-}PbZrO_3$ two component system, the ferroelectric ceramic of three-component system comprising of the composite perovskite compound, $PbTiO_3$ and $PbZrO_3$ demonstrated excellent properties as a single domain powder. Remarkable improvements in both relative permittivity and piezoelectric constants were achieved in the single domain powder H containing sample as compared with the multiple domain powder I.

EXAMPLE 7

Commercially available $BaCO_3$ powder and $TiO_2$ powder having purities of 99% or higher were combined in equimolecular amounts, mixed in the same manner as in Example 1, shaped and then heated at a temperature of 1,100° C. over a period of 4 hours using a high aluminous crucible and thereby a solid phase reaction was accomplished to result in the formation of $BaTiO_3$.

About half of the resulting product was immediately thrown into water. Through such a rapid cooling treatment, the product finely pulverized was obtained which is referred to as the single domain powder J.

The residual portion consisting of a solid mass was subjected to a repetition of rapid cooling or gentle grinding and thereby a powder having the similar properties was readily obtained. Therefore, this powder also was employed as the single domain powder J.

Figure 7:
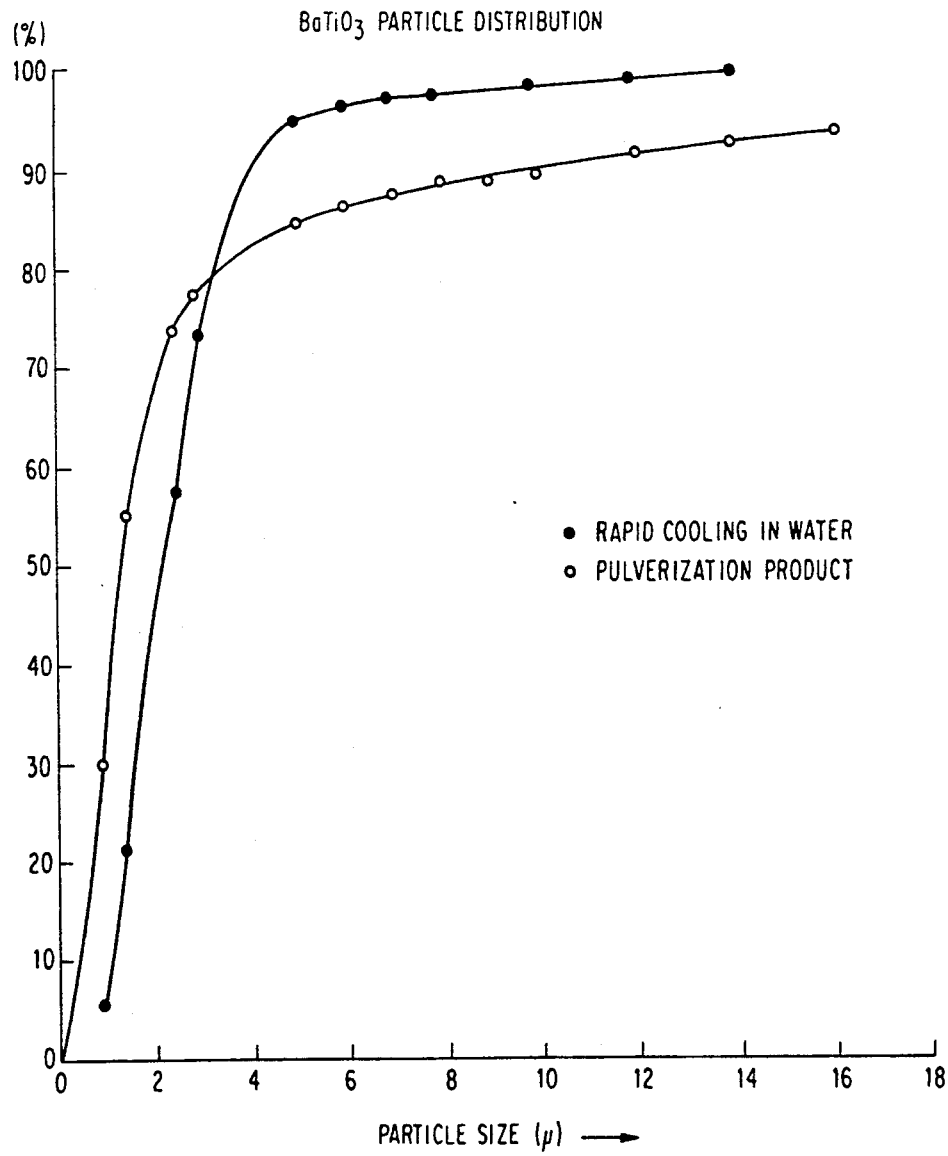
FIGS. 7 and 8 are the graphs of size distributions of $BaTiO_3$ and $PbTiO_3$ powders, respectively, which illustrate the differences resulting from the changes in pulverizing means.

On the other hand, the product prepared in the same solid phase reaction process was ground to a powder under a wet condition over a period of 16 hours in the same manner as in Example 1. The powder obtained is referred to as the multiple domain powder K. Both powders J and K were dried and compared with each other. The average grain size of the powder J was $1.56\mu$ and that of the powder K was $0.83\mu$. The size distributions of these powders are shown in FIG. 7.

Each of the powders J and K was mixed with chloroprene rubber in a mixing ratio (by volume) of 3:2. The chloroprene rubber had been previously prepared by combining 100 parts by weight of chloroprene rubber, 4 parts by weight of MgO and 5 parts by weight of ZnO and then by dissolving the resulting combination in a proper solvent in an appropriate concentration.

Each of the resulting mixtures was subjected to kneading and rolling treatments in a conventional manner to prepare a piezoelectric rubber sheet. The thus-obtained sheets were examined for piezoelectric properties, and the results set forth in Table 10 were obtained. In the case of $BaTiO_3$ also noticeable effects were not observed by mixing the ceramic powder pulverized through the conventional grinding process. For example, the output potential of the powder K was only 13% for that of the single domain powder J.

TABLE 10

|  | Powder J | Powder K |
|---|---|---|
| Output Potential (V) Generated by Falling of Ball |  |  |
| H = 10 cm | 2.9 | 0.3 |
| H = 100 cm | 20 | 2.6 |
| Relative Permittivity $\epsilon/\epsilon_0$ (at 1 KHz) | 49 | 38.4 |
| Piezoelectric Constants |  |  |
| $d_{31}$ ($\times 10^{-12}$ m/V) | 31.2 | 3.7 |
| $g_{31}$ ($\times 10^{-3}$ V-m/N) | 72 | 10.8 |
| Average Grain Size ($\mu$) | 1.56 | 0.83 |

EXAMPLE 8

Equimolar amounts of $Pb(NO_3)_2$ and $Ti(OC_3H_7)_4$ were dissolved in nitric acid and diluted with water. Then, $NH_4OH$ was added thereto with stirring so as to keep the pH value of the solution in the range of 7 to 8. The thus-obtained precipitates of the hydroxides of the individual elements were washed with water, filtered and dried at a temperature of 110° C. The resulting condensate was dissociated using a ball mill and then it was maintained at a temperature of 850° C. for 6 hours. It was allowed to stand for a while until it had cooled down. Thus, the fine powder of $PbTiO_3$ was obtained, the average grain size of which was 2.2μ. This powder is referred to as powder L.

Separately, a portion of the coprecipitate obtained was maintained at a temperature of 1,100° C. for 4 hours and then allowed to stand until the product cooled down. The average size of the thus-obtained $PbTiO_3$ powder was 12.6μ. Therefore, it is thought that an appreciable grain growth took place and that giant grains were formed by fused adhesion among grains. This powder is referred to as powder M. Next, in order to improve upon the dispersibility of the powder into a polymer, powder M was ground under a wet condition for 16 hours in the same manner as described in the preceding examples to obtain a powder having an average grain size of 2.2μ. This powder is powder N.

Figure 8:
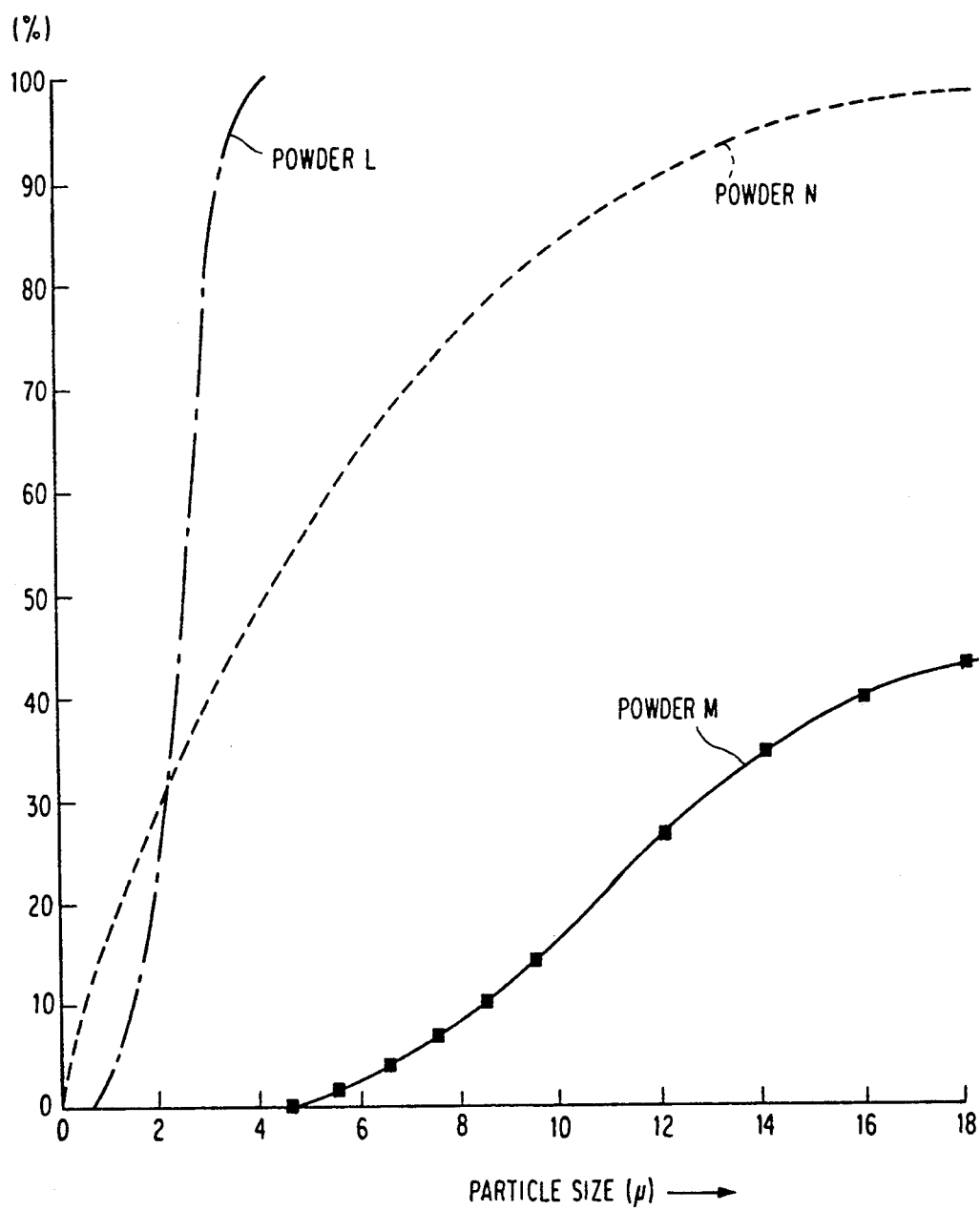
Figure 9A:
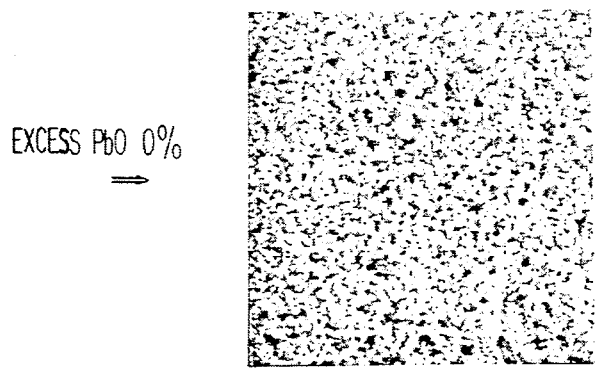
FIG. 9($a$)–($e$) are scanning electromicroscope photographs showing the differences in the crystal lattice where excess PbO is present and absent and the differences where the etching treatment is and is not carried out (magnification×500).
Figure 9B:
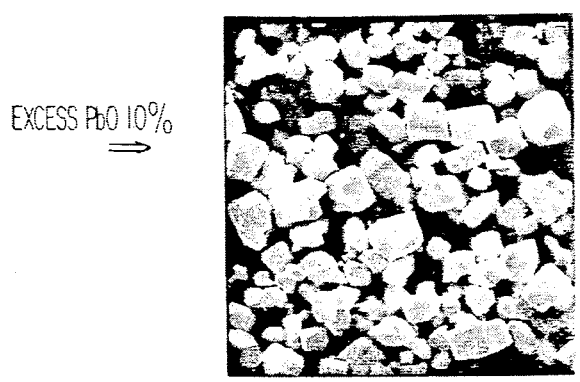
Figure 9C:
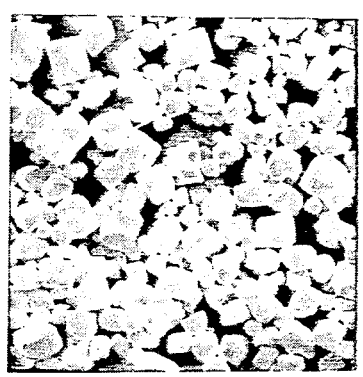
Figure 9D:
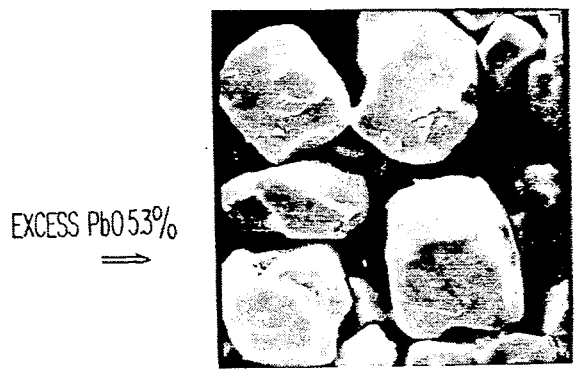
Figure 9E:

The size distribution curves of powders L, M and N are shown in FIG. 8. Each of these powders was combined with the fluororubber in a mixing ratio (by volume) of 3:2, and mixed. Each of samples was tested for its piezoelectric properties and the results obtained are set forth in Table 11.

TABLE 11

|  | Powder L | Powder M | Powder N |
| --- | --- | --- | --- |
| Pulverizing Condition | 850° C. | 1,100° C. | Ground (m) |
| Average Grain Size (μ) | 2.2 | 12.6 | 2.2 |
| Output Potential (V) Generated by Falling of Ball |  |  |  |
| H = 10 cm | 9.0 | 2.4 | 1.1 |
| H = 100 cm | 45.8 | 14.4 | 7.0 |
| Relative Permittivity $\epsilon/\epsilon_0$ (at 1 KHz) | 40 | 37 | 33 |
| Piezoelectric Constants |  |  |  |
| $d_{31}$ ($\times 10^{-12}$ m/V) | 47.1 | 14.3 | 7.1 |
| $g_{31}$ ($\times 10^{-3}$ V-m/N) | 132 | 43 | 21 |

The results obtained show that in the process for preparing the pulverized product through the thermal decomposition of the coprecipitate, fused adhesion takes place among grains when heating is carried out at a high temperature to form giant grains and thereby a dispersive mixing with a polymer becomes impossible, which is the reason for a noticeable decrease in the piezoelectric property imparting effect. It is necessary for the giant grain-containing powder to be subjected to a conventional grinding treatment in order to improve the dispersibility thereof, but such a treatment causes the formation of multiple domains and thereby the powder loses a simple directionality and a sharp deterioration in piezoelectric properties results. Therefore, it is essential that pyrolysis of the coprecipitate also is carried out at a temperature as low as possible.

EXAMPLE 9

Commercial PbO having a purity of 99% or higher and commercial $TiO_2$ having a purity of 98% or higher were compounded in amounts appropriate for the composition $PbTiO_3$ with excess PbO as shown in Table 12. A 2.5 kg portion of the composition was weighed out and mixed by means of a vibrational mill over a 5-hour interval under a dry condition.

Two separate portions of 200 g of the resulting mixture were weighed out and each of them was subjected to shaping using a mold under an applied pressure of 50 kg/cm$^2$ to form a tablet having an outside diameter of 60 mm and thickness of 20 mm. Each of the tablets was placed in a high aluminous crucible and heated at a temperature of 850° C. in an atmosphere of PbO over a period of 4 hours to effect a solid phase reaction. Thus, the product having the above-described composition, namely $PbTiO_3$+x parts by weight of PbO was obtained.

Immediately after the conclusion of heating one of the resulting tablets was thrown into water from the crucible and thus finely pulverized. Such finely pulverized matter obtained by rapid cooling is referred to as matter pulverized by "quenching" hereafter.

The other portion was allowed to stand inside the crucible as it cooled to room temperature. Then, the resulting lead titanate block was taken out of the crucible, ground to a coarse powder by means of a mortar and further ground to a fine powder using 300 g of alumina spherulite in a high aluminous ball mill having a volume of 2 liters under a wet condition over a period of 8 hours. The thus-obtained powder was employed for comparison, and is referred to hereinafter as matter pulverized by "mechanical grinding".

The results obtained are summarized in Table 12. It is apparent from the table that excess PbO affects markedly the enlargement of the crystal grains of the matter pulverized by quenching. The magnitude of such an effect is proportional to the amount of excess PbO. For instance, in the case of 17.6 parts by weight excess PbO, crystal grains obtained had an average diameter of 40μ, and it is about 20 times that of crystal grains obtained in the absence of excess PbO (which is 2.2μ). The average diameter was measured using a specific surface area meter. The increase in grain size as described above contributes to the increase in the fluidity of the compound and consequently to the improvement in the workability of the compound. In addition, the matter pulverized by quenching, as can be seen clearly in the scanning type electron microscope photograph (magnification:×500) shown in FIG. 9, is composed of isolated, individual crystal grains and contains no fine fragments caused by grinding or crushing and furthermore the edges and corners of the individual crystal grains are relatively rounded because it does not require any further mechanical grinding treatments. In addition, analogous to the above-described examples, the sizes of the individual crystal grains are in good agreement with one another, that is, uniform.

Figure 10:
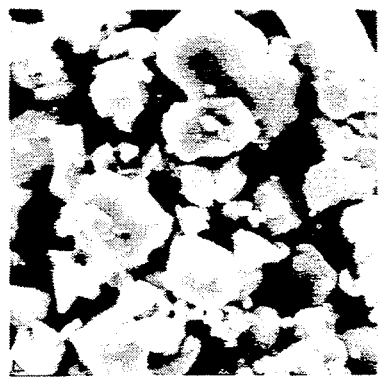
FIG. 10 is a scanning electromicroscope photograph showing Nb added lead titanate zirconate obtained from the general synthesis-crushing (16 hrs) steps.

For the purpose of comparison, a scanning type electron microscope photograph (magnification: ×5,000) of an Nb-containing lead titanate zirconate ceramic powder obtained by way of conventional preparation-grinding (over a period of 16 hours) process is shown in FIG. 10. Such a powder, which had been mechanically ground and had not received any further treatments, was composed predominantly of fragments generated by mechanical destruction and therefore the fractured planes of the fragments had sharp blade-like edges. Accordingly, when such a powder is compounded with a polymer having high pliability to prepare a composite material, mechanical destruction caused by the sharp edges, such as partial rupture of polymers, perforation and the like, are apt to take place upon deformation of the composite material resulting from external forces applied thereto and consequently the composite material comes to suffer a serious disadvantage that it is hard and fragile, namely it possesses low mechanical strength.

Figure 11:
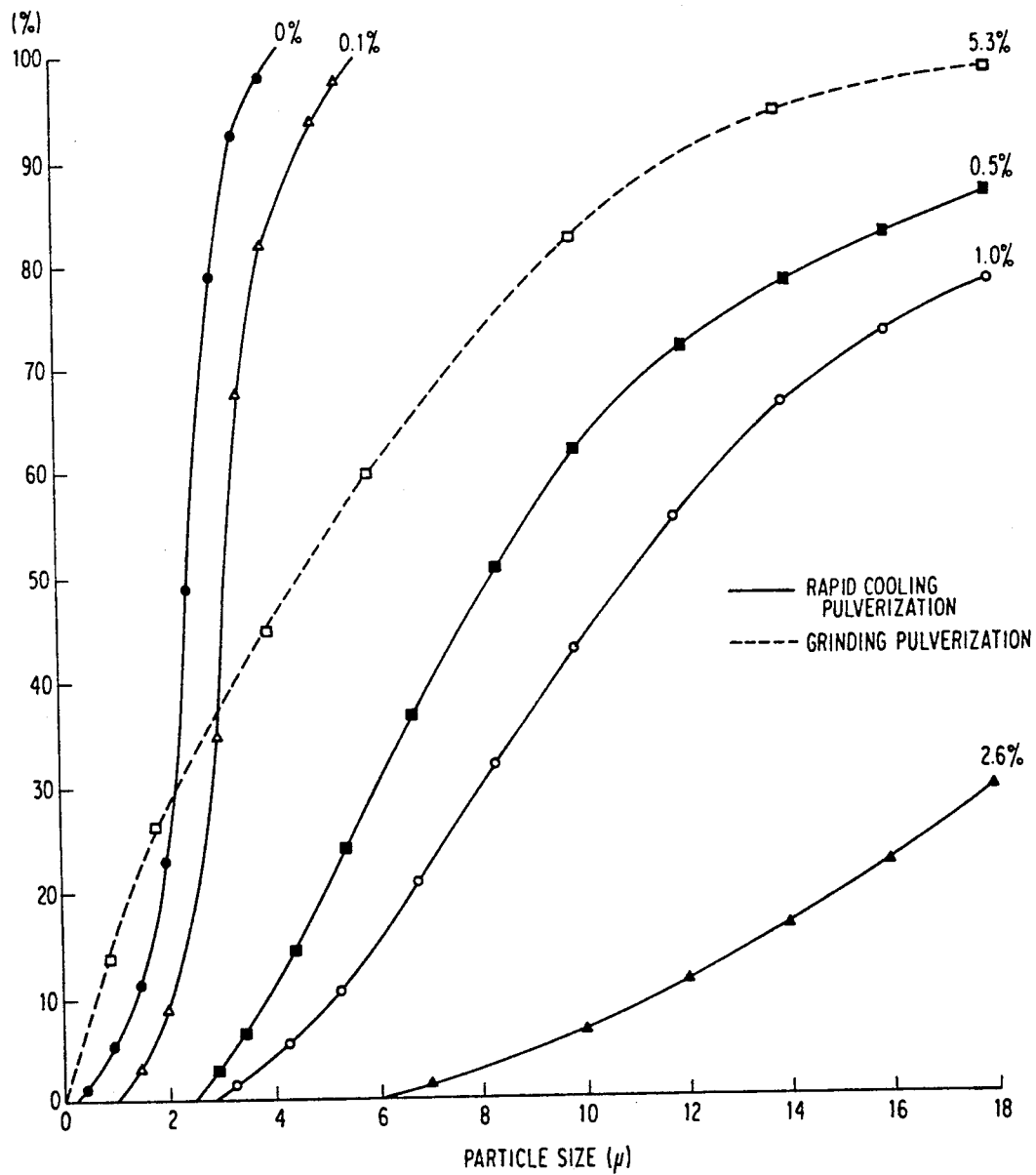

The enlargement of crystal grain size of the matter pulverized by quenching with increasing excess PbO will become still clearer by examining the size distribution of each of the matters pulverized by quenching which differ in the excess amount of PbO. Each of the samples in which excess PbO was contained in amounts from 0 to 1.0 wt % was dispersed in a 0.05% aqueous solution of sodium pyrophosphate and the size distribution thereof was measured. In cases of samples containing excess PbO in proportions ranging from 2.6% to 11.1%, the crystal grains obtained were coarse. Their size was measured by means of a low tapping-type sieve shaker at 290 rpm, 156 rpm (tapps per minute) over 5 minutes and the weight of the sample used was 100 g. The data obtained is shown in FIG. 11 and FIG. 12.

In the figures, the size distribution of the mechanically ground powder, which had the composition wherein 5.3 parts by weight of excess PbO was contained and was pulverized by 8 hours grinding by means of a trommel after the conclusion of cooling in the kiln, is also represented by the broken line for the purpose of comparison together with the data of quenched powders of the present invention. In a conventional grinding manner, the grinding efficiency is so high that only fine grains having an average diameter of $3.0\mu$, which is much smaller than the average diameter of the matter pulverized by quenching ($30\mu$) and corresponds to the value differing in the figure by one, are obtained. Further, it has been practically impossible to obtain coarse grains having an average diameter of 20 to $40\mu$ using conventional industrial techniques. In addition, finely divided and coarsely divided fragments are produced by the mechanical grinding treatment in large numbers and consequently the sizes of grains obtained are not uniform.

On the other hand, the matter pulverized by quenching rarely contains finely divided grains measuring several microns or smaller in size and that does not contain any very large grains generated by aggregation of several grains. Namely, grains constituting the matter pulverized by quenching are present in a state that individual grains are isolated to single grains. Therefore, the size distribution curve thereof is narrow, and the sizes of the grains are uniform. Further, since it is unnecessary to subject the matter pulverized by quenching to any more powerful mechanical grinding treatments for the purpose of the completion of pulverization, such a matter is not attended with such structural fractures as observed in mechanical grinding treatments and therefore such a matter is presumed to be composed of microcrystals having virtually single domains.

Figure 13A:
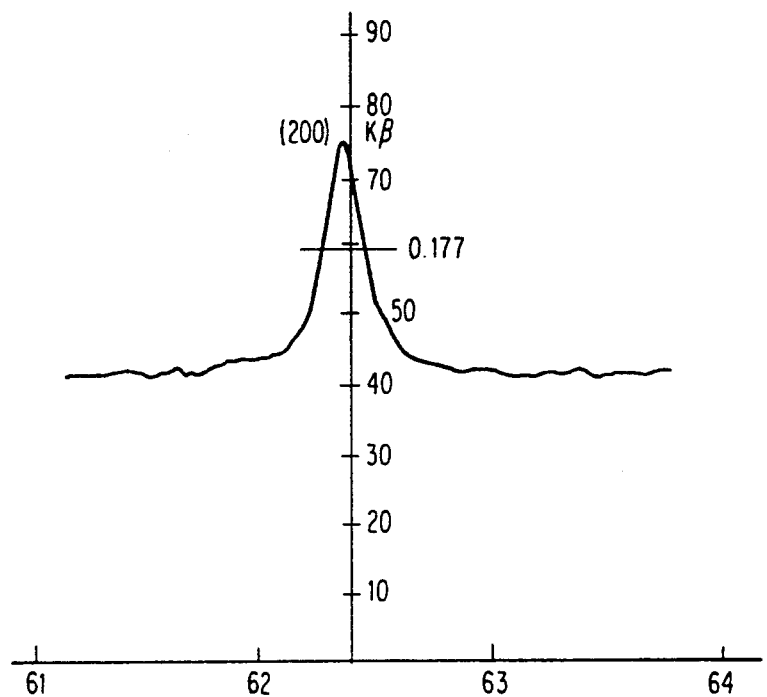
FIG. 13 ($a$) and ($b$) are graphs showing X-ray diffraction patterns of the powders obtained by etching treatment after rapid cooling crushing and obtained by mechanical crushing where excess PbO is present.
Figure 13B:
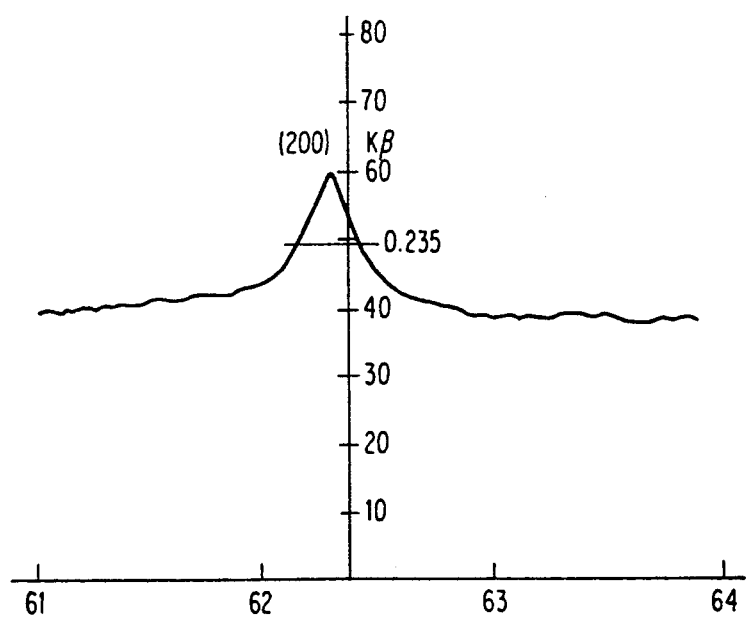

The above-described presumption can be verified by the X-ray diffraction pattern shown in FIG. 13-(a). Therein, the peak corresponding to $K\beta$ ray from the (200) plane is sharp, and the half width value thereof is 0.177 degree when represented by the angle of $\Delta 2\theta$ and needless to say it is very narrow. The above-described fact indicates that domains existing in individual grains are arranged in order, and present in a state close to a single domain. In such a state as described above, the ability to orient the domains in the direction of an applied electric field (namely polarizability) is excellent. For instance, on the occasion that a polymer composite material prepared by combining the matter pulverized by quenching and a polymer is applied to use as a piezoelectric material, it is found from the data set forth in Table 12 that the domains existing in the resulting composite material can orient in the direction of an applied electric field even under a condition that electric field strength is reduced to a great extent similarly to the results illustrated in the above-described examples and thereby the composite material can exhibit very excellent piezoelectric characteristics.

In contrast the powder obtained by pulverization using a conventional grinding technique after heat preparation is supposed to cause structural fractures in its constituent crystal grains to result in the generation of numerous multiple domains and subsequent distortion therein. Such a presumption is verified by an X-ray diffraction pattern shown in FIG. 13-(b). Therein, the peak corresponding to $K\beta$ ray from the (200) plane is low and broad, and the half width thereof is large and has a value of 0.235 degree.

Even if such a powder is combined with a polymer, orientation in the direction of an applied electric field is no longer caused in the resulting composite material only to a small extent, and the composite material exhibits markedly reduced piezoelectric characteristics. Accordingly, the effect resulting from the mixing of a ceramic powder can be hardly observed therein.

Such piezoelectric characteristics were evaluated as follows: 10 parts by weight of chloroprene rubber was mixed with 100 parts by weight of the matter pulverized by quenching or mechanical grinding (which corresponds to 3:2, converted to a volume basis of mixing ratio of the latter to the former) and further a vulcanizing agent (ZnO: 5 parts by weight, MgO: 4 parts by weight) and an accelerator were added thereto. Then, the mixture was kneaded using an open-roll, and rolled in the form of a sheet having thickness of 0.5 mm. In the thus-obtained ceramic rubber sheet, the larger the grain size of the powder used, the higher the plasticity of the ceramic rubber sheet obtained and consequently the easier roller molding became.

Next, a conductive rubber sheet was prepared from the mixture obtained by adding 35 parts by weight of carbon black, a vulcanizing agent and an accelerator to 100 parts by weight of chloroprene rubber in the same manner as described above.

The thus-obtained rubber sheets were stuck to both sides of the above-described ceramic rubber sheet, and the resulting matter was subjected to a vulcanizing treatment at a temperature of 170° C. under pressure of 7 kg/cm$^2$ over a period of 15 minutes to produce a laminate. The laminate was soaked in silicone oil heated to 100° C. and thereto direct potential of 100–150 KV/cm was applied for 30 minutes, resulting in the polarization of the ceramic rubber sheet. The thus-polarized laminate was cut into 15 mm square pieces.

Each of the samples with respect to various kinds of piezoelectric rubber sheets was examined for output potential created by the falling of a ball (from the height (H) of 10 cm) according to the method described in Example 1.

Making an additional remark, excess PbO, which possesses such an effect as to increase remarkably the grain size, as described in detail hereinbefore, separates out and deposits on the surface of individual crystal grains obtained after pulverization through quenching and therefore the layer made of such PbO can be removed therefrom by way of a chemical etching treatment and the residual crystal grains become better-ordered and fairer ones.

Every sample prepared herein (in Example 9), unless otherwise noted, was subjected to prescribed examinations after it had received the etching treatment.

As an etching solution, a dilute solution of acetic acid obtained by adding water to the special reagent grade glacial acetic acid in a volume ratio of 1:1 was prepared. The powder obtained by pulverization through quenching was put in an amount of 100 ml into a 300 ml beaker and thereto the above-described etching solution was added in such an amount as to make the total volume 200 ml. The resulting suspension was stirred for 8 hours by means of a magnetic stirrer and then it was allowed to stand for 16 hours as it was. Thus, the etching treatment was effected.

As can be obviously seen from the comparison in the photographs of FIG. 9, the treatment of this kind can contribute to the production of pure well-ordered single crystals.

TABLE 12

|  | Pulverization Technique | Etching Treatment | Excess PbO × wt % | Average Grain Size ($\mu$) | Output Potential due to Ball Falling (V) H = 10 cm |
|---|---|---|---|---|---|
| Invention | Quenching | Received | 0.1 | 3.0 | 8.8 |
| " | Quenching | Received | 0.5 | 7.3 | 9.5 |
| " | Quenching | Received | 1.0 | 9.7 | 13.1 |
| " | Quenching | Received | 2.6 | 21.0 | 14.7 |
| " | Quenching | Not Received | 5.3 | 30.5 | 11.4 |
| " | Quenching | Received | 5.3 | 30.0 | 12.6 |
| " | Quenching | Received | 11.1 | 35.0 | 11.6 |
| " | Quenching | Received | 17.6 | 40.0 | 11.0 |
| Comparison | Mechanical Grinding | Not Received | 0 | 2.2 | 8.0 |
| " | Mechanical Grinding | Not Received | 5.3 | 3.0 | 4.0 |

In case that $PbTiO_3$ ceramic has the stoichiometric composition and consequently does not contain excess PbO at all, even if the burning temperature was raised (e.g., 1,100° C. or more) to obtain large-size crystal grains, there were many disadvantages such that the grain size attained was about 13$\mu$ at most. In addition, the rise in burning temperature was attended with various disadvantages that a sintering temperature also became high and therefore high electric power supply was required; burning at a high temperature caused the loss of PbO to result in the deviation from the stoichiometric composition and subsequent decomposition and thereby imperfections or defects in the crystal lattice were increased, a kiln used suffered a drastic damage; and so on. Accordingly, the preparation of large-size crystal grain of ceramic has been practically impossible.

However, such an object can be attained in the present invention with the excess PbO-containing composition. The present invention has many advantages that a grain size of 40-50$\mu$ can be easily attained at a relatively low temperature (e.g., 850° C.) and that it is also possible to obtain very large grains having a size of several hundred microns if temperature, time and the addition amount of PbO are properly selected; the intended grains can be obtained under a condition of relatively low temperature and therefore electric power consumed can be reduced; imperfections and defects in the crystal lattice can be reduced in number; damage of a kiln used can be reduced to a smaller extent; and so on. Accordingly, the present invention enables easy preparation of very large-size, single domain, simplified crystal grains and consequently preparation of piezoelectric polymer composite materials having both excellent piezoelectric characteristics and excellent workability.

It has been confirmed that the ferroelectric ceramic powders consisting of virtually single domain microcrystals can bring about similar effects upon the composite materials regardless of their pulverization methods, for instance, pulverization through rapid cooling, pyrolysis of coprecipitate and a powdery treatment including a solid phase reaction process under applied heat, which are described in detail in the examples.

High piezoelectric properties can be achieved in the piezoelectric polymer composite materials of the present invention without losing the characteristics of the polymers employed. Accordingly, the composite materials of the present invention can be employed as a transducer between electric energy and mechanical energy, as a transducer between electric energy and sonic energy and as pyroelectric materials. More specifically, they can be employed as sheets or films capable of transforming stress, light or heat into electricity, or contrary to such transformations, sheets or films capable of transforming electricity into displacement or vibration. Such sheets or films have a wide variety of uses in fields where the pliability of macromolecular substances acts to advantage such as in hemadynamometers, sphygmometers, a heartbeat meters and other detecting elements for the human body, and fields where high piezoelectric properties may be required such as sonic transducers, physical property measurements, piezoelectric keyboard switches and so on.

In accordance with embodiments of the present invention, piezoelectric polymer composite materials possessing both the high piezoelectric properties inherent to the ferroelectric electric ceramic and high pliability inherent to the polymer can be obtained.

While the invention has been described in detail and with reference to specific embodiments thereof, it will be apparent to one skilled in the art that various changes and modifications can be made therein without departing from the spirit and scope thereof.

What is claimed is:

1. In a method for preparing ferroelectric ceramic microcrystals which comprises reacting a ferroelectric ceramic and pulverizing the reaction product, the improvement which comprises rapidly cooling the reaction product to pulverize it to obtain the ferroelectric ceramic microcrystals which comprise virtually single domain microcrystals.

2. The method of claim 1, wherein said rapidly cooling is at a temperature of about 10° C./minute or more.

3. In the method of preparing the ferroelectric ceramic microcrystals of claim 1, the improvement wherein said ferroelectric ceramic microcrystals have values of half widths of peaks assigned to the (002) plane up to 15.5 degrees.

4. In a method for preparing ferroelectric ceramic microcrystals which comprises heating appropriate mixed starting powders which correspond to the ferroelectric ceramic microcrystals to obtain a reaction product and pulverizing the reaction product resulting from said heating, the improvement which comprises rapidly cooling the reaction product to pulverize the reaction product, whereby the ferroelectric ceramic microcrystals are obtained which comprise virtually single domain microcrystals.

5. The method of claim 4, wherein said rapidly cooling is at a temperature of about 10° C./minute or more.

6. In a method for preparing ferroelectric ceramic microcrystals which comprises temporarily molding appropriate mixed starting powders which correspond to the ferroelectric ceramic microcrystals by a conventional wet or dry molding, heating the resulting shaped product to cause a solid phase reaction and pulverizing the product of the solid phase reaction, the improvement which comprises rapidly cooling the product of the solid phase reaction to thereby pulverize it and obtain the ferroelectric ceramic microcrystals which comprise virtually single domain microcrystals.

7. The method of claim 6, wherein said rapidly cooling is at a temperature of about 10° C./minute or more.

8. In a method for preparing ferroelectric ceramic microcrystals which comprises temporarily molding appropriate mixed starting powders which correspond to the ferroelectric microcrystals by a conventional wet or dry molding, sintering the resultant shaped product and pulverizing the resulting product, the improvement which comprises rapidly cooling the sintered product to thereby pulverize the sintered product and obtain the ferroelectric ceramic microcrystals which comprise virtually single domain microcrystals.

9. The method of claim 8, wherein said rapidly cooling is at a temperature of about 10° C./minute or more.

10. In a method for preparing ferroelectric ceramic microcrystals which comprises heating appropriate mixed starting powders which correspond to the ferroelectric microcrystals to obtain powdery product which has undergone a solid phase reaction during the heating, temporarily shaping the powdery product into a temporary form by wet or dry molding, sintering the resulting temporarily shaped product and pulverizing the sintered product, the improvement which comprises rapidly cooling the sintered shaped product to thereby pulverize it and obtain the ferroelectric ceramic microcapsules which comprise virtually single domain microcrystals.

11. The method of claim 10, wherein said rapidly cooling is at a temperature of about 10° C./minute or more.

12. In a method for preparing ferroelectric ceramic microcrystals which comprises heating appropriate mixed starting powders which correspond to the ferroelectric ceramic microcrystals to cause the starting powders to undergo a solid phase reaction, further rapidly cooling the resulting reaction product to pulverize it, temporarily shaping the pulverized product into a temporary form by a conventional wet or dry molding, sintering the resulting temporarily shaped product and pulverizing the sintered product, the improvement which comprises rapidly cooling the sintered shaped product to thereby pulverize it and obtain the ferroelectric ceramic microcapsules which comprise virtually single domain microcrystals.

13. The method of claim 12, wherein said rapidly cooling is at a temperature of about 10° C./minute or more.

14. In a method for preparing ferroelectric ceramic microcrystals which comprises temporarily molding appropriate mixed starting powders which correspond to the ferroelectric ceramic microcrystals and heating the temporary molding to cause the temporary molding to undergo a solid phase reaction, pulverizing the resulting reaction product, temporarily shaping the resulting pulverized product, sintering the shaped product and pulverizing the resulting sintered product, the improvement which comprises rapidly cooling the resulting sintered product to thereby pulverize it and obtain the ferroelectric ceramic microcapsules which comprise virtually single domain microcrystals.

15. The method of claim 14, wherein said rapidly cooling is at a temperature of about 10° C./minute or more.

16. In a method for preparing ferroelectric ceramic microcrystals which comprises heating appropriate mixed starting powders which correspond to the ferroelectric ceramic microcrystals to cause the mixed starting powders to undergo a solid phase reaction, temporarily shaping the solid phase reaction product, sintering the temporarily shaped solid phase reaction product and pulverizing the temporarily shaped sintered reaction product, the improvement which comprises rapidly cooling the sintered temporarily shaped reaction product to thereby pulverize it and obtain the ferroelectric ceramic microcrystals which comprise virtually single domain microcrystals.

17. The method of claim 16, wherein said rapidly cooling is at a temperature of about 10° C./minute or more.

18. In a method for preparing ferroelectric ceramic microcrystals which comprises thermally decomposing a coprecipitate of appropriate mixed starting salts which correspond to the ferroelectric ceramic microcrystals, the improvement which comprises rapidly cooling the thermally decomposed product to thereby pulverize it and obtain the ferroelectric ceramic microcapsules which comprise virtually single domain microcrystals.

19. A method for preparing ferroelectric ceramic microcrystals which comprises repeating the treatment of claim 1, 4, 6, 8, 10, 12, 14, 16 or 18 two times or more.

20. A method for preparing ferroelectric ceramic microcrystals of claim 4, 6, 8, 10, 12, 14, 16, or 18 wherein said appropriate mixed starting powders or salts are mixed in a proportion which corresponds to the composition of the desired ferroelectric ceramic microcrystals.

21. A method for preparing ferroelectric ceramic microcrystals of claim 4, 6, 8, 10, 12, 14, 16 or 18 wherein said mixed starting powders or salts are mixed in a proportion which corresponds to the composition of the desired ferroelectric ceramic microcrystals, and at least one excess lead oxide or at least one excess lead salt are added in the case of using a member selected from the group consisting of individual ferroelectric ceramics containing lead selected from the group consisting of Perovskite structures selected from (1) to (4):
(1) lead-containing barium titanate solid solutions containing as the main component barium titanate;
(2) lead titanate and solid solutions containing as the main component lead titanate;
(3) lead titanate zirconate and solid solutions containing this salt as the main component; and
(4) three-component ceramics consisting of solid solutions containing lead titanate zirconate and as a third component a salt of lead oxide and other metal oxides belonging to one of the following groups (a) to (f):
(a) oxides represented by the formula:

$$A^{2+}(B_{\frac{1}{3}}^{2+}.B_{\frac{2}{3}}^{5+})O_3$$

where $A^{2+}$ is Pb, Sr or Ba; $B^{2+}$ is Zn, Cd, Mg, Ni or Co and $B^{5+}$ is Nb or Ta;
(b) oxides represented by the formula:

$$A^{2+}(B_{\frac{1}{2}}^{2+}.B_{\frac{1}{2}}^{6+})O_3$$

where $A^{2+}$ is Pb; $B^{2+}$ is Cd, Mn, Zn, Mg, Co or Ni and $B^{6+}$ is W or Te;
(c) oxides represented by the formula:

$$A^{2+}(B_{\frac{1}{2}}^{3+}.B_{\frac{1}{2}}^{5+})O_3$$

where $A^{2+}$ is Pb, Ba or Ca; $B^{3+}$ is Fe, Sc, Cr, Yb, Lu or In and $B^{5+}$ is Nb or Ta;
(d) oxides represented by the formula:

$$A^{2+}(B_{\frac{2}{3}}^{3+}.B_{\frac{1}{3}}^{6+})O_3$$

where $A^{2+}$ is Pb; $B^{3+}$ is Fe and $B^{6+}$ is W;
(e) oxides represented by the formula:

$$A^{3+}(B_{\frac{1}{2}}^{2+}.B_{\frac{1}{2}}^{4+})O_3$$

where $A^{3+}$ is La or Nd; $B^{2+}$ is Mg and $B^{4+}$ is Ti;
(f) oxides represented by the formula:

$$(A_{\frac{1}{2}}^{1+}.A_{\frac{1}{2}}^{3+})BO_3$$

where $A^{1+}$ is Na or K; $A^{3+}$ is La, Ce, Nd or Bi and B is Ti;
tungsten bronze structures;
bismuth layer structures;
ceramics which contain as a basic composition the above ferroelectric ceramics, wherein a part of the Pb is replaced by an alkaline earth metal(s); and
ceramics which contain as a basic composition the above individual ferroelectric ceramics and further contain, as a supplemental component, one or more oxides selected from the following group I, II, or III for the purpose of modification:
I. $Nb_2O_5$, $Ta_2O_5$, $La_2O_3$, $Sb_2O_5$, $Sb_2O_3$, $Bi_2O_3$ and $WO_3$;
II. $MgO$, $Fe_2O_3$, $Sc_2O_3$ and $K_2O$; and
III. $Cr_2O_3$, $U_2O_3$ and $MnO_2$.

22. A method for preparing ferroelectric ceramic microcrystals of claim 1, 4, 6, 8, 10, 12, 14, 16, or 18 wherein said ferroelectric ceramic microcrystals contain as a basic composition a member selected from the group consisting of the following individual ferroelectric ceramics:

Perovskite structures selected from (1) to (5):
(1) barium titanate and solid solutions containing as the main component barium titanate;
(2) lead titanate and solid solutions containing as the main component lead titanate;
(3) lead titanate zirconate and solid solutions containing this salt as the main component; and
(4) three-component ceramics consisting of solid solutions containing lead titanate zirconate and as a third component a salt of lead oxide and other metal oxides belonging to one of the following groups (a) to (f):
(a) oxides represented by the formula:

$$A^{2+}(B_{\frac{1}{3}}^{2+}.B_{\frac{2}{3}}^{5+})O_3$$

where $A^{2+}$ is Pb, Sr or Ba; $B^{2+}$ is Zn, Cd, Mg, Ni or Co and $B^{5+}$ is Nb or Ta;
(b) oxides represented by the formula:

$$A^{2+}(B_{\frac{1}{2}}^{2+}.B_{\frac{1}{2}}^{6+})O_3$$

where $A^{2+}$ is Pb; $B^{2+}$ is Cd, Mn, Zn, Co or Ni and $B^{6+}$ is W or Te;
(c) oxides represented by the formula:

$$A^{2+}(B_{\frac{1}{2}}^{3+}.B_{\frac{1}{2}}^{5+})O_3$$

where $A^{2+}$ is Pb; Ba or Ca; $B^{3+}$ is Fe, Sc, Cr, Yb, Lu or In and $B^{5+}$ is Nb or Ta;
(d) oxides represented by the formula:

$$A^{2+}(B_{\frac{2}{3}}^{3+}.B_{\frac{1}{3}}^{6+})O_3$$

where $A^{2+}$ is Pb; $B^{3+}$ is Fe and $B^{6+}$ is W;
(e) oxides represented by the formula:

$$A^{3+}(B_{\frac{1}{2}}^{2+}.B_{\frac{1}{2}}^{4+})O_3$$

where $A^{3+}$ is La or Nd; $B^{2+}$ is Mg and $B^{4+}$ is Ti;
(f) oxides represented by the formula:

$$(A_{\frac{1}{2}}^{1+}.A_{\frac{1}{2}}^{3+})BO_3$$

where $A^{1+}$ is Na or K; $A^{3+}$ is La, Ce, Nd or Bi and B is Ti; and
(5) solid solutions containing $NaNbO_3$;
II. tungsten bronze structures;
III. bismuth layer structures;
IV. $LiNbO_3$, $LiTaO_3$;
ceramics which contain as a basic composition the above ferroelectric ceramics, wherein a part of the Pb is replaced by an alkaline earth metal(s);
ceramics which contain as a basic composition the above individual ferroelectric ceramics and further contain, as a supplemental component, one or more oxides selected from the following group I, II, or III for the purpose of modification:
I. $Nb_2O_5$, $Ta_2O_5$, $La_2O_3$, $Sb_2O_5$, $Sb_2O_3$, $Bi_2O_3$ and $WO_3$;

II. MgO, Fe$_2$O$_3$, Sc$_2$O$_3$ and K$_2$O; and
III. Cr$_2$O$_3$, U$_2$O$_3$ and MnO$_2$; and
ceramics which contain as a basic composition the above ferroelectric ceramics, wherein the Pb component is present in excess of the stoichiometric amount.

23. A method for preparing ferroelectric ceramic microcrystals of claims 4, 6, 8, 10, 12, 14, 16, or 18 wherein the purity of said starting powders or salts is about 98% or more.

24. A method for preparing ferroelectric ceramic microcrystals of claims 1, 4, 6, 8, 10, 12, 14, 16 or 18 wherein said rapid cooling is at about 10° C./minute or more.

25. A method for preparing ferroelectric ceramic microcrystals of claims 1, 4, 6, 8, 10, 12, 14, 16, or 18 wherein said product is further subjected to an etching.

26. A method for preparing ferroelectric ceramic microcrystals of claim 25 wherein etching is carried out utilizing an acid or alkali solution, the pH of the acid solution being about 3 or less and the pH of the alkali solution being about 13 or more, or using hydrogen peroxide.

27. A method for preparing ferroelectric ceramic microcrystals of claims 1, 4, 6, 8, 10, 12, 14, 16, or 18 wherein said ferroelectric ceramic powder contains 90% or more of grains in a particle size range of about 1 to 400$\mu$ and wherein the proportion of fine powder having a diameter of 0.2$\mu$ or less is about 3% or less.

28. A method for preparing ferroelectric ceramic microcrystals of claim 26, wherein said ferroelectric ceramic powder contains 90% or more of grains in a particle size range of about 1 to 400$\mu$ and wherein the proportion of fine powder having a diameter of 0.2$\mu$ or less is about 3% or less.

29. A method for preparing ferroelectric ceramic microcrystals of claim 26, wherein said mixed starting powders of salts are mixed in a proportion which corresponds to the composition of the desired ferroelectric ceramic powder or salt, and at least one excess lead oxide or at least one excess lead salt are added in the case of using a member selected from the group consisting of individual ferroelectric ceramics containing lead selected from the group consisting of Perovskite structures selected from (1) to (4):
(1) lead-containing barium titanate solid solutions containing as the main component barium titanate;
(2) lead titanate and solid solutions containing as the main component lead titanate;
(3) lead titanate zirconate and solid solutions containing this salt as the main component; and
(4) three-component ceramics consisting of solid solutions containing lead titanate zirconate and as a third component a salt of lead oxide and other metal oxides belonging to one of the following groups (a) to (f):
(a) oxides represented by the formula:

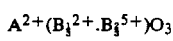

where A$^{2+}$ is Pb, Sr or Ba; B$^{2+}$ is Zn, Cd, Mg, Ni or Co and B$^{5+}$ is Nb or Ta;
(b) oxides represented by the formula:

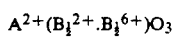

where A$^{2+}$ is Pb; B$^{2+}$ is Cd, Mn, Zn, Mg, Co or Ni and B$^{6+}$ is W or Te;

(c) oxides represented by the formula:

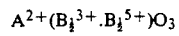

where A$^{2+}$ is Pb, Ba or Ca; B$^{3+}$ is Fe, Sc, Cr, Yb, Lu or In and B$^{5+}$ is Nb or Ta;
(d) oxides represented by the formula:

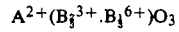

where A$^{2+}$ is Pb; B$^{3+}$ is Fe and B$^{6+}$ is W;
(e) oxides represented by the formula:

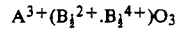

where A$^{3+}$ is La or Nd; B$^{2+}$ is Mg and B$^{4+}$ is Ti;
(f) oxides represented by the formula:

where A$^{1+}$ is Na or K; A$^{3+}$ is La, Ce, Nd or Bi and B is Ti;
tungsten bronze structures;
bismuth layer structures;
ceramics which contain as a basic composition the above individual ferroelectric ceramics, wherein a part of the Pb is replaced by an alkaline earth metal(s); and
ceramics which contain as a basic composition the above ferroelectric ceramics and further contain, as a supplemental component, one or more oxides selected from the following group I, II, or III for the purpose of modification:
I. Nb$_2$O$_5$, Ta$_2$O$_5$, La$_2$O$_3$, Sb$_2$O$_5$, Sb$_2$O$_3$, Bi$_2$O$_3$ and WO$_3$;
II. MgO, Fe$_2$O$_3$, Sc$_2$O$_3$ and K$_2$O; and
III. Cr$_2$O$_3$, U$_2$O$_3$ and MnO$_2$.

30. A method for preparing ferroelectric ceramic microcrystals of claim 27, wherein said ferroelectric ceramic microcrystals contain as a basic composition a member selected from the group consisting of the following individual ferroelectric ceramics:
Perovskite structures selected from (1) to (5):
(1) barium titanate and solid solutions containing as the main component barium titanate;
(2) lead titanate and solid solutions containing as the main component lead titanate;
(3) lead titanate zirconate and solid solutions containing this salt as the main component; and
(4) three-component ceramics consisting of solid solutions containing lead titanate zirconate and as a third component a salt of lead oxide and other metal oxides belonging to one of the following groups (a) to (f):
(a) oxides represented by the formula:

$A^{2+}(B_{\frac{1}{3}}^{2+}.B_{\frac{2}{3}}^{5+})O_3$ where A$^{2+}$ is Pb, Sr or Ba; B$^{2+}$ is Zn, Cd, Mg, Ni or Co and B$^{5+}$ is Nb or Ta;
(b) oxides represented by the formula:

$A^{2+}(B_{\frac{1}{2}}^{2+}.B_{\frac{1}{2}}^{6+})O_3$ where A$^{2+}$ is Pb; B$^{2+}$ is Cd, Mn, Zn, Mg, Co or Ni and B$^{6+}$ is W or Te;
(c) oxides represented by the formula:

$A^{2+}(B_{\frac{1}{3}}^{3+} \cdot B_{\frac{2}{3}}^{5+})O_3$ where $A^{2+}$ is Pb, Ba or Ca; $B^{3+}$ is Fe, Sc, Cr, Yb, Lu or In and $B^{5+}$ is Nb or Ta;
(d) oxides represented by the formula:

$A^{2+}(B_{\frac{2}{3}}^{3+} \cdot B_{\frac{1}{3}}^{6+})O_3$ where $A^{2+}$ is Pb; $B^{3+}$ is Fe and $B^{6+}$ is W;
(e) oxides represented by the formula:

$A^{3+}(B_{\frac{1}{2}}^{2+} \cdot B_{\frac{1}{2}}^{4+})O_3$ where $A^{3+}$ is La or Nd; $B^{2+}$ is Mg and $B^{4+}$ is Ti;
(f) oxides represented by the formula:

$(A_{\frac{1}{2}}^{1+} \cdot A_{\frac{1}{2}}^{3+})BO_3$ where $A^{1+}$ is Na or K; $A^{3+}$ is La, Ce, Nd or Bi and B is Ti; and
(5) solid solutions containing $NaNbO_3$;
II. tungsten bronze structures;
III. bismuth layer structures;
IV. $LiNbO_3$, $LiTaO_3$;
ceramics which contain as a basic composition the above ferroelectric ceramics, wherein a part of the Pb is replaced by an alkaline earth metal(s);
ceramics which contain as a basic composition the above ferroelectric ceramics and further contain, as a supplemental component, one or more oxides selected from the following group I, II, or III for the purpose of modification:
I. $Nb_2O_5$, $Ta_2O_5$, $La_2O_3$, $Sb_2O_5$, $Sb_2O_3$, $Bi_2O_3$ and $WO_3$;
II. $MgO$, $Fe_2O_3$, $Sc_2O_3$ and $K_2O$; and
III. $Cr_2O_3$, $U_2O_3$ and $MnO_2$; and
ceramics which contain as a basic composition the above ferroelectric ceramics, wherein the Pb component is present in excess of the stoichiometric amount.

31. The method of claim 18, wherein said rapidly cooling is at a temperature of about 10° C./minute or more.

* * * * *